US012200958B2

(12) United States Patent
Jeong et al.

(10) Patent No.: US 12,200,958 B2
(45) Date of Patent: Jan. 14, 2025

(54) DISPLAY DEVICE

(71) Applicant: SAMSUNG DISPLAY CO., LTD., Yongin-si (KR)

(72) Inventors: Ye Ri Jeong, Suwon-si (KR); Il Joo Kim, Hwaseong-si (KR); Won Jun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 478 days.

(21) Appl. No.: 17/485,890

(22) Filed: Sep. 27, 2021

(65) Prior Publication Data

US 2022/0246880 A1 Aug. 4, 2022

(30) Foreign Application Priority Data

Feb. 3, 2021 (KR) .......................... 10-2021-0015243

(51) Int. Cl.

| *H10K 50/844* | (2023.01) |
|---|---|
| *G06F 3/041* | (2006.01) |
| *G06F 3/044* | (2006.01) |
| *H10K 59/131* | (2023.01) |
| *H10K 59/40* | (2023.01) |

(52) U.S. Cl.
CPC ......... *H10K 50/844* (2023.02); *G06F 3/0412* (2013.01); *G06F 3/0446* (2019.05); *H10K 59/131* (2023.02); *H10K 59/40* (2023.02)

(58) Field of Classification Search
CPC ......... G06F 2203/04103; G06F 3/0412; G06F 3/0446; G06F 2203/04111; H10K 50/844; H10K 59/40; H10K 59/131
See application file for complete search history.

(56) References Cited

U.S. PATENT DOCUMENTS

| 2018/0053466 A1* | 2/2018 | Zhang ................... G01L 1/2281 |
|---|---|---|
| 2018/0158894 A1* | 6/2018 | Park ................... H10K 59/8731 |
| 2018/0226617 A1* | 8/2018 | Nakagawa ........... G09G 3/3233 |
| 2020/0242986 A1* | 7/2020 | Lee ........................ G06F 1/1652 |
| 2021/0257592 A1* | 8/2021 | Lee ........................ G06F 3/0412 |
| 2021/0384225 A1* | 12/2021 | Zhang ...................... G09G 3/20 |
| 2022/0003810 A1* | 1/2022 | Ye .......................... G06F 3/0412 |

FOREIGN PATENT DOCUMENTS

| KR | 10-1797651 | 11/2017 |
|---|---|---|
| KR | 10-1834792 | 3/2018 |
| KR | 10-2018-0131011 | 12/2018 |
| KR | 10-2020-0066415 | 6/2020 |

* cited by examiner

*Primary Examiner* — Jaehwan Oh

(74) *Attorney, Agent, or Firm* — F. CHAU & ASSOCIATES, LLC

(57) ABSTRACT

A display device includes a substrate, a plurality of pixels disposed on the substrate, an encapsulation layer disposed above the plurality of pixels and comprising an organic encapsulation film, a dam structure disposed on the substrate and surrounding an outer boundary of the plurality of pixels, and crack detection lines comprising an output line disposed on the dam structure without overlapping with the organic encapsulation film, and an input line electrically connected to the output line and disposed on the organic encapsulation film.

23 Claims, 18 Drawing Sheets

DISPLAY DEVICE

CROSS-REFERENCE TO RELATED APPLICATION

This application claims priority under 35 U.S.C. § 119 to Korean Patent Application No. 10-2021-0015243, filed on Feb. 3, 2021 in the Korean Intellectual Property Office, and the contents of which in its entirety are herein incorporated by reference.

BACKGROUND

1. Field of the Disclosure

The present disclosure relates to a display device, more particularly to a device with crack detection lines.

2. Description of the Related Art

As the information-oriented society evolves, various demands for display devices are ever increasing. The display device includes: a light-receiving display device such as a liquid-crystal display device, a field emission display device, and a light-emitting display device; an organic light-emitting display device including an organic light-emitting element; an inorganic light-emitting display device including an inorganic light-emitting element such as an inorganic semiconductor; and a light-emitting display device such as a micro-light-emitting display device including a micro-light-emitting element.

Such a display device includes a display panel for generating and displaying images and various input means. Recently, a touch panel that recognizes a touch input has been widely employed for display devices of smart phones or tablet PCs. A touch panel determines whether a touch input is received, and, if any, finds the coordinates of the position of the touch input.

SUMMARY

Aspects of the present disclosure provide a display device capable of detecting a crack in an encapsulation layer.

An embodiment of a display device includes a substrate, a plurality of pixels disposed on the substrate, an encapsulation layer disposed above the plurality of pixels and comprising an organic encapsulation film, a first dam structure disposed on the substrate and surrounding an outer boundary of the plurality of pixels when viewed from top, and a plurality of crack detection lines comprising an output line disposed on the first dam structure without overlapping the organic encapsulation film, and an input line electrically connected to the output line and disposed on the organic encapsulation film.

An embodiment of a display device includes a display panel comprising first and second side surfaces, and a front surface disposed therebetween in a first direction, the first and second side surfaces being disposed on opposite sides of the front surface in the first direction, respectively, and being curved. The display panel includes a plurality of pixels, a plurality of crack detection lines comprising an output line and an input line which are adjacent to an outer boundary of the plurality of pixels and extend along an edge of the display panel, and a crack detection member electrically connected to the output line. The output line and the input line extend across the front surface, the first side surface and the second side surface. The output line is disposed on an outer side of the input line and is electrically connected to the input line.

According to an embodiment of the present disclosure, it is possible to detect a crack in an encapsulation layer of a display device so that the reliability of the display device may improve.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present disclosure will be described with reference to the accompanying drawings.

Figure 1:
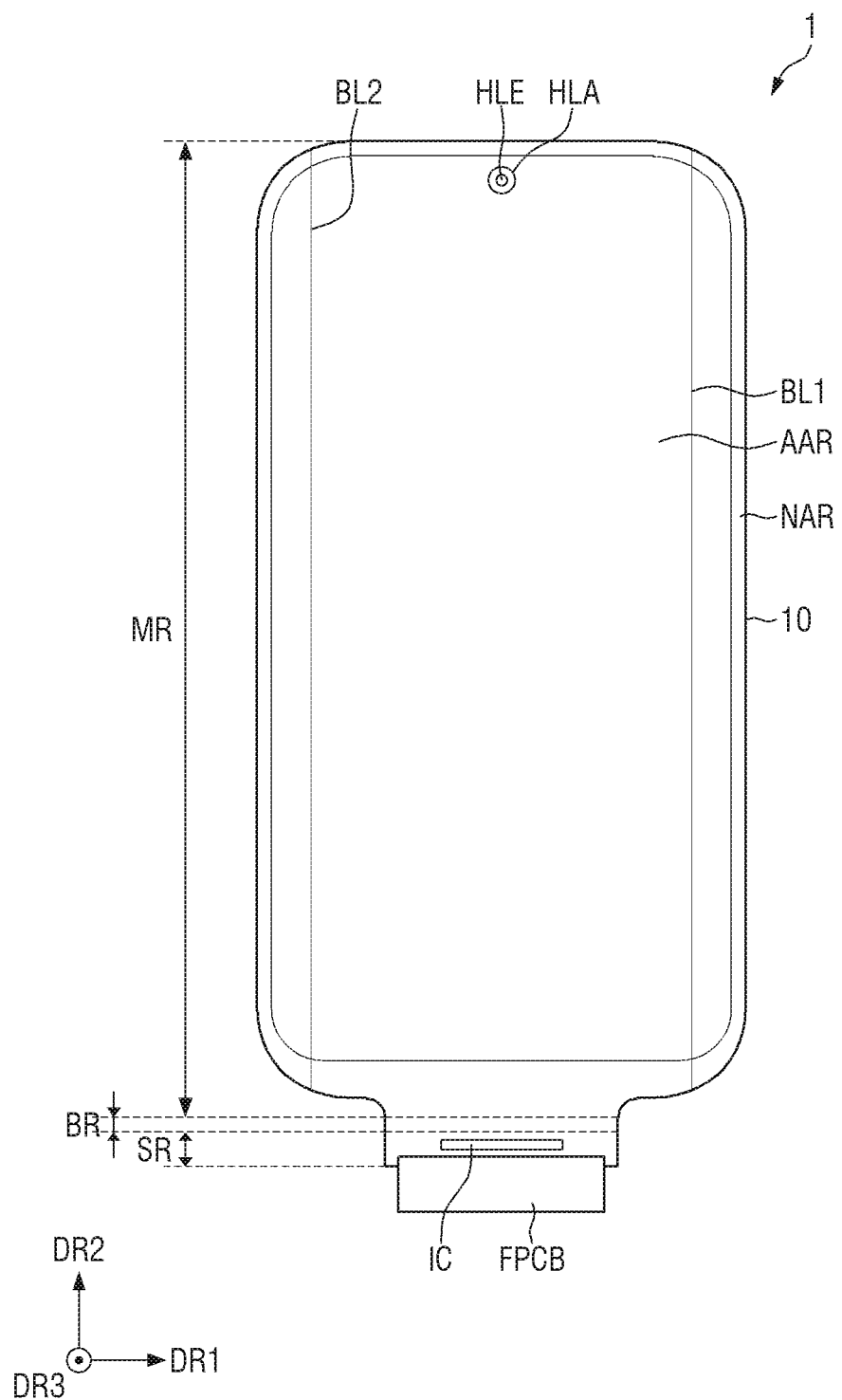
FIG. 1 is an expanded view of a display device according to an embodiment of the present disclosure.
Figure 2:
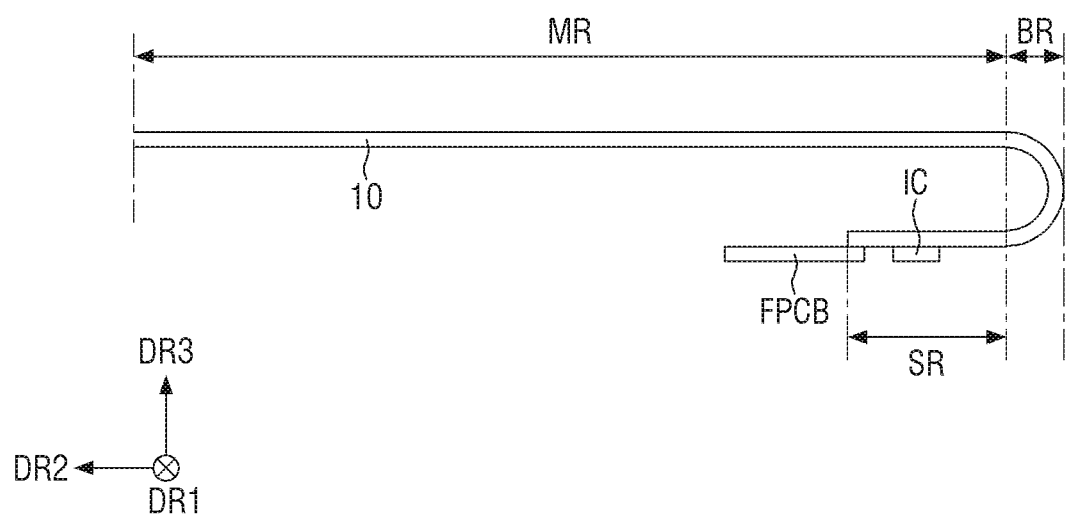
FIG. 2 is a side view of a part of FIG. 1 according to an embodiment of the present disclosure.

FIG. 1 is an expanded view of a display device according to an embodiment of the present disclosure; FIG. 2 is a side view of a part of FIG. 1.

According to embodiments, a first direction D1 and a second direction D2 are different directions from each other and may intersect each other. In the plan view of FIG. 1, the first direction DR1 is defined as the horizontal direction and the second direction DR2 is defined as the vertical direction for convenience of illustration. In the following description, a first side in the first direction DR1 indicates the right side, a second side in the first direction DR1 indicates the left side, a first side in the second direction DR2 indicates the upper side, and a second side in the second direction DR2 indicates the lower side when viewed from the top.

A third direction DR3 refers to a direction that crosses the plane where the first direction DR1 and the second direction DR2 are located. For example, the third direction DR3 is perpendicular to both the first direction DR1 and the second direction DR2. It should be understood that the directions referred with respect to the embodiments are relative directions, and the embodiments are not limited to the directions mentioned.

As used herein, the terms "top", "upper surface" and "upper side" in the third direction DR3 refer to the display side of a display panel 10, whereas the terms "bottom", "lower surface" and "lower" refer to the opposite side of the display panel 10, unless stated otherwise.

Referring to FIGS. 1 and 2, a display device 1 may refer to any electronic device providing a display screen. The display device 1 may include portable electronic devices for providing a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, and Internet of Things devices.

The display device 1 includes an active area AAR and a non-active area NAR. In the display device 1, a display area may be defined as the area where images are displayed, a non-display area may be defined as the area where no image is displayed, and a touch area may be defined as the area where a touch input is sensed. Then, the display area and the touch area may be included in the active area AAR. The display area and the touch area may overlap each other. For example, in the active area AAR, images are displayed, and a touch input is sensed.

The shape of the active area AAR may be a rectangle or a rectangle with rounded corners in the expanded view. In the example shown, the shape of the active area AAR is a rectangle that has rounded corners and has its sides in the first direction DR1 longer than its sides in the second direction DR2. It is, however, to be understood that the present disclosure is not limited thereto. The active area AAR may have various shapes such as a rectangular shape with its sides in the second direction DR2 longer than its sides in the first direction DR1, a square shape, other polygonal shapes, a circular shape, and an elliptical shape.

The non-active area NAR is disposed around the active area AAR. The non-active area NAR may be a bezel area. The non-active area NAR may surround the active area AAR. It is, however, to be understood that the present disclosure is not limited thereto. For example, the non-active area NAR may not be disposed near the upper side of the active area AAR or near the left or right side thereof.

In the non-active area NAR, signal lines for applying signals to the active area AAR (display area or touch area), or driving circuits may be disposed. The non-active area NAR may include no display area. Further, the non-active area NAR may include no touch area. In an embodiment, the non-active area NAR may include a part of the touch area, and a sensor member such as a pressure sensor may be disposed in that part. In some embodiments, the active area AAR may be completely identical to the display area where images are displayed, and the non-active area NAR may be completely identical to the non-display area where no image is displayed.

The display device 1 includes a display panel 10 for providing a display screen. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, or an electrowetting display panel. In the following description, an organic light-emitting display panel is employed as an example of the display panel 10, but the present disclosure is not limited thereto. Any other display panel may be employed as long as the technical idea of the present disclosure may be equally applied.

The display panel 10 may include a plurality of pixels. The plurality of pixels may be arranged in a matrix. The shape of each pixel may be, but is not limited to, a rectangle or a square when viewed from the top. Each pixel may have a diamond shape having sides inclined with respect to the first direction DR1 or the second direction DR2. Each pixel may include an emission area. Each emission area may have the same shape as or a different shape from the shape of the pixels. For example, when the pixels have a rectangular shape, the shape of the emission area of each of the pixels may have various shapes such as a rectangle, a diamond, a hexagon, an octagon, and a circle. The pixels and the emission areas will be described in detail later.

The display device 1 may further include a touch member for sensing a touch input. The touch member may be implemented as a panel or film separated from the display panel 10 to be attached on the display panel 10 or may be implemented in the form of a touch layer TSL (see FIG. 13) inside the display panel 10. In the following description, although the touch member is provided inside the touch panel to be included in the display panel 10 in the form of the touch layer TSL (see FIG. 13), it is to be understood that the present disclosure is not limited thereto.

The display panel 10 may include or may be formed of a flexible substrate. For example, the flexible substrate may include or may be formed of a flexible polymer material such as polyimide. Accordingly, the display panel 10 may be curved, bent, folded, or rolled.

The display panel 10 may include a main region MR, a bending region BR, and a sub-region SR.

The display panel 10 may be divided into the main region MR located on one side of the bending region BR in the second direction DR2 and the subsidiary region SR located on the opposite side of the bending region BR in the second direction DR2.

The main region MR may have a shape similar to the appearance of the display device 1 when viewed from the top. At least one of the edges of the main region MR except for the edge (side) connected to the bending region BR may be bent to form a curved surface or may be bent at a right angle. When at least one of the edges of the main region MR except for the edge (side) connected to the bending region BR is curved or bent, the display area may also be disposed at the edge. It is, however, to be understood that the present disclosure is not limited thereto. The curved or bent edge may be the non-display area that does not display image, or the display area and the non-display area may be disposed together. Detailed descriptions thereon will be given later.

The display area of the display panel 10 is located in the main region MR. According to an embodiment of the present disclosure, the edge portions of the display area in the main region MR, the entire bending region BR and the entire subsidiary region SR may be the non-display area. It is, however, to be understood that the present disclosure is not limited thereto. The bending region BR and/or the subsidiary region SR may also include the display area.

The bending region BR is connected to the second side of the main region MR in the second direction DR2. For example, the bending region BR may be connected to the lower shorter side of the main region MR. The width of the bending region BR may be less than the width (width of the shorter side) of the main region MR. The portions where the main region MR meets the bending region BR may be cut in an L-shape.

The display panel 10 may be bent in the bending region BR. For example, in the bending region BR, the display panel 10 may be bent downward in the thickness direction, i.e., in the direction away from the display surface with a curvature. Although the bending region BR may have a constant radius of curvature, the present disclosure is not limited thereto. It may have different radii of curvature at different sections of the bending region BR. As the display panel 10 is bent at the bending region BR, the surface of the display panel 10 may be reversed. For example, the surface of the display panel 10 facing upward may be bent such that it faces outward at the bending region BR and then faces downward.

The subsidiary region SR is extended from the bending region BR. The subsidiary region SR may be extended in a direction parallel to the main region MR from the end of the bending region. The sub region SR may overlap the main region MR in the thickness direction of the display panel 10. The width of the sub-region SR (the width in the first direction DR1) may be, but is not limited to being, equal to the width of the bending region BR.

A driver chip IC may be disposed in the subsidiary region SR. The driving chip IC may include an integrated circuit for driving the display panel 10. The integrated circuit may include an integrated circuit for display and/or an integrated circuit for a touch unit. The integrated circuit for a display and the integrated circuit for a touch unit may be provided as separate chips or may be integrated into a single chip.

A pad area may be disposed at the end of the subsidiary region SR of the display panel 10. The pad area may include display signal line pads and touch signal line pads. A drive circuit board FPCB may be connected to the pad area at the end of the subsidiary region SR of the display panel 10. The drive circuit board FPCB may be a flexible printed circuit board or a film.

At least one edge of the display panel 10 may be bent. For example, two opposite edges of the display panel 10 at one side and the opposite side in the first direction DR1 may be bent along a first bending line BL1 and a second bending line BL2, respectively. More detailed description thereon will be given with reference to FIGS. 3 and 4. It is, however, to be understood that the present disclosure is not limited thereto. Bending lines may be formed at one edge and the opposite edge in the second direction DR2 so that the display panel may be bent along the bending lines.

Figure 3:
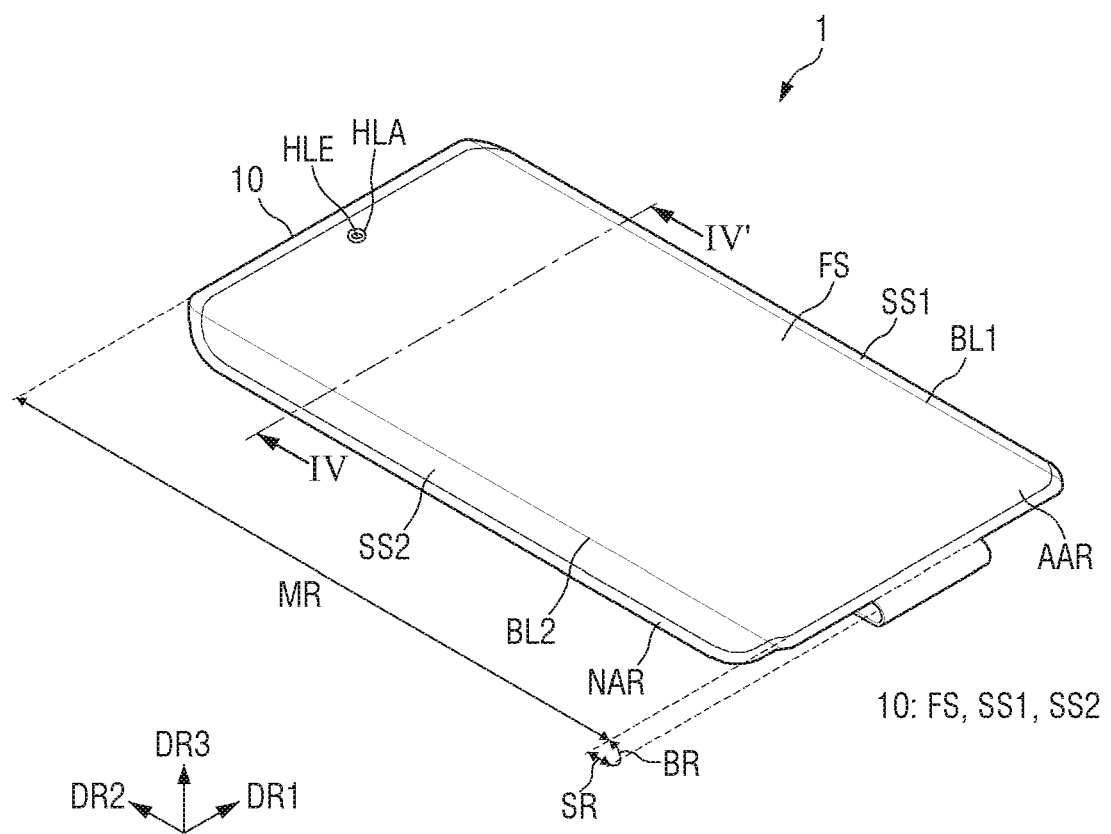
FIG. 3 is a perspective view of a display device according to an embodiment of the present disclosure.
Figure 4:
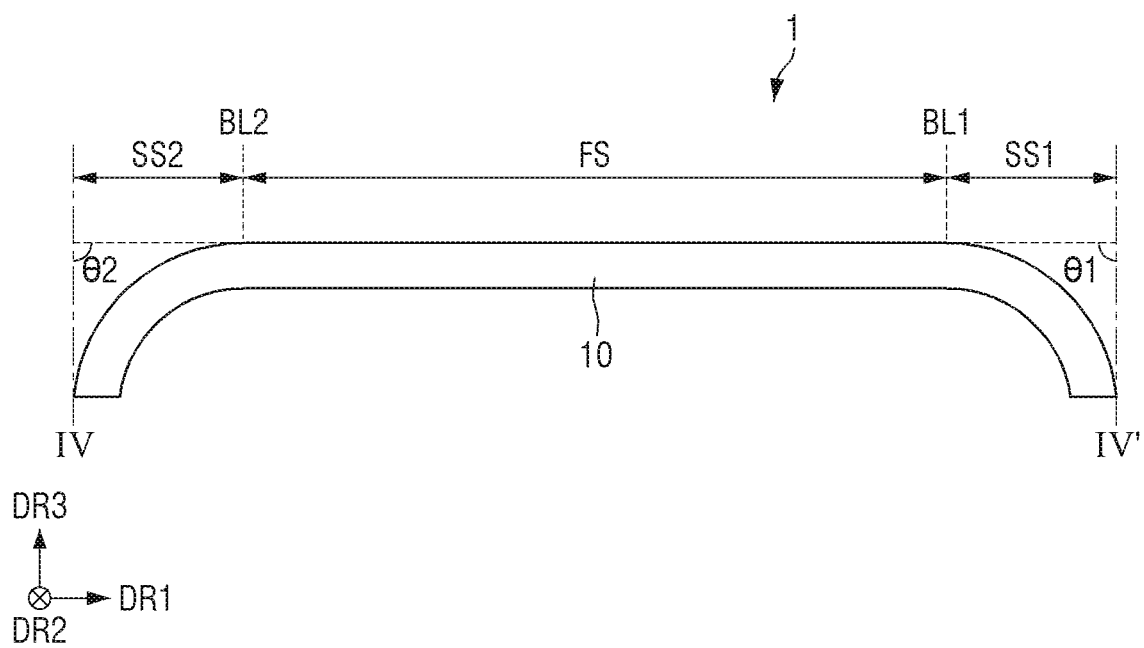
FIG. 4 is a cross-sectional view taken along line IV-IV' of FIG. 3 according to an embodiment of the present disclosure.

FIG. 3 is a perspective view of a display device according to an embodiment of the present disclosure. FIG. 4 is a cross-sectional view taken along line IV-IV' of FIG. 3. FIGS. 3 and 4 show the display device 1 when one edge and the opposite edge of the display panel 10 in the first direction DR1 are bent.

Referring to FIGS. 3 and 4, the display panel 10 may include a front surface FS, a first side surface SS1 and a second side surface SS2. The entire front surface FS may be substantially flat, but the present disclosure is not limited thereto. At least a part of the front surface FS may have a convex or concave shape in the thickness direction (the third direction DR3). The front surface FS may have a rectangular shape having shorter sides in the first direction DR1 and longer sides in the second direction DR2. The front surface FS may have rounded corners when viewed from the top. The front surface FS may have rounded polygonal corners when viewed from the top. For example, as shown in FIG. 1, the front surface FS may have a rectangular shape with rounded corners, but the present disclosure is not limited thereto.

The first side surface SS1 and the second side surface SS2 may be extended outward from the edge of the front surface FS to be bent at a predetermined angle. The first side surface SS1 and the second side surface SS2 may be distinguished from the front surface FS by the first bending line BL1 and the second bending line BL2, respectively. The side surfaces SS may be bent from the front surface FS at an angle equal to or greater than 90 degrees and less than 180 degrees. It is, however, to be understood that the present disclosure is not limited thereto. For example, an angle θ1 by which the first side surface SS1 is bent relative to the front surface FS and an angle θ2 by which the second side surface SS2 is bent relative to the front surface FS may be 90°.

When the front surface FS has a rectangular shape when viewed from the top, the first side surface SS1 may be extended from the front surface FS in the first direction DR1, and the second side surface SS2 may be extended from the front surface FS in the opposite direction to the first direction DR1. Each of the first side surface SS1 and the second side surface SS2 may have a rounded shape when viewed from the top, but the present disclosure is not limited thereto. For example, the first side surface SS1 may have rounded shapes on one side and the opposite side in the second direction DR2, respectively. It is, however, to be understood that the present disclosure is not limited thereto.

Each of the first side surface SS1 and the second side surface SS2 may be extended from the front surface FS to have a predetermined curvature, and may have a rounded shape in cross-sectional view. Each of the first side surface SS1 and the second side surface SS2 may have a shape that is convex to the outside of the display device 1. For example, the first side surface SS1 may have a first curvature, and the second side surface SS2 may have a second curvature. The first curvature may be equal to the second curvature, but are not limited thereto. The first curvature may be different from the second curvature.

For example, the active area AAR may be disposed across the front surface FS, the first side surface SS1 and the second side surface SS2, and the non-active area NAR may be disposed on the outer side of the active area AAR and may be disposed across the front surface FS, the first side surface SS1 and the second side surface SS2.

Figure 5:
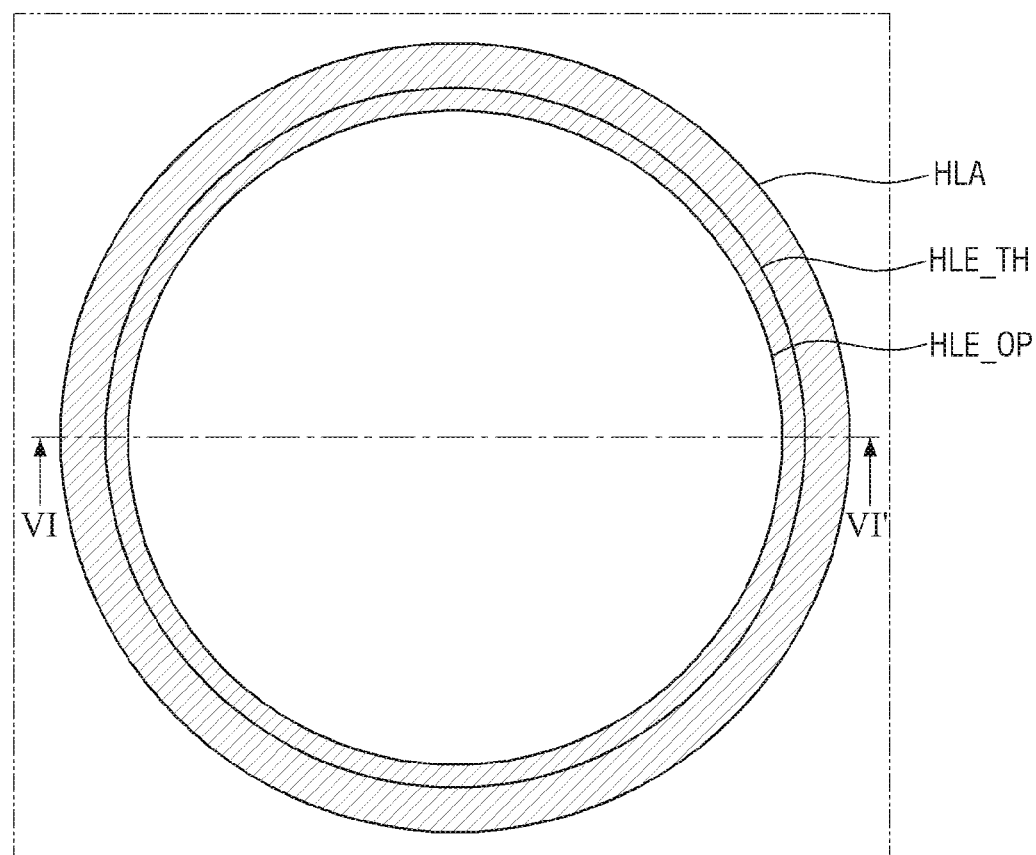
FIG. 5 is a view showing the arrangement relationship of the elements around a hole area when viewed from the top, according to an embodiment of the present disclosure.
Figure 6:
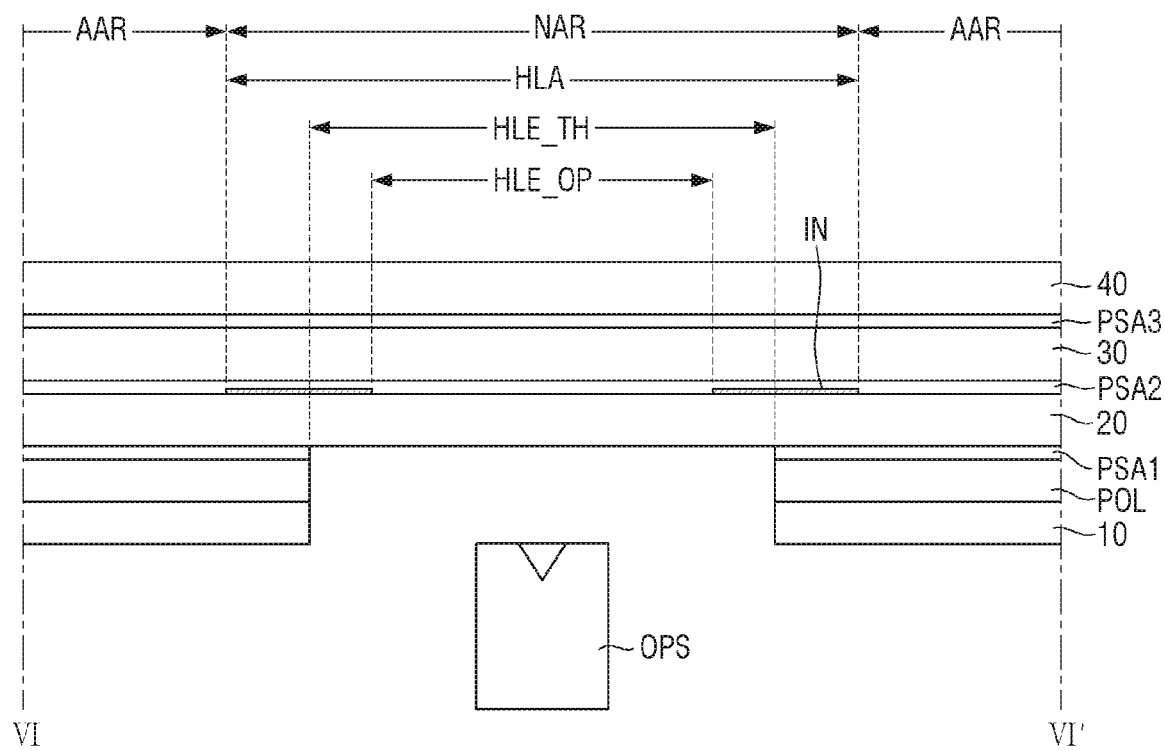
FIG. 6 is a cross-sectional view taken along line VI-VI' of FIG. 5 according to an embodiment of the present disclosure.

FIG. 5 is a view showing the arrangement relationship of the elements around a hole area when viewed from the top. FIG. 6 is a cross-sectional view taken along line VI-VI' of FIG. 5.

Referring to FIGS. 5 and 6, the display device 1 may further include an anti-reflection member POL, a shock-absorbing layer 20, a cover window 30 and a cover window protection layer 40 which are sequentially stacked on one another on one side of the display panel 10 in the thickness direction (the third direction DR3).

At least one coupling member, such as an adhesive layer and a detachable layer, may be disposed between the elements stacked on one another to couple them. For example, the display device 1 may further include a first coupling member PSA1, a second coupling member PSA2 and a third coupling member PSA3. The first coupling member PSA1 couples the anti-reflection member POL with the shock-absorbing layer 20 between the anti-reflection member POL and the shock-absorbing layer 20. The second coupling member PSA2 couples the shock-absorbing layer 20 with the cover window 30 between the shock-absorbing layer 20 and the cover window 30. The third coupling member PSA3 couples the cover window 30 with the cover window protection layer 40 between the cover window 30 and the cover window protection layer 40. It is, however, to be understood that the present disclosure is not limited thereto. Another layer may be further disposed between the layers, and some of the elements stacked on one another may be eliminated.

The anti-reflection member POL may be disposed on the display panel 10. The anti-reflection member POL may reduce reflection of external light. The anti-reflection member POL may be implemented as a polarizing film. The anti-reflection member POL polarizes the light passing therethrough. It is, however, to be understood that the present disclosure is not limited thereto. The anti-reflection member POL may be implemented as a color filter layer in the display panel 10.

The shock-absorbing layer 20 may be disposed on the anti-reflection member POL. The shock-absorbing layer 20 may increase the durability of the cover window 30 and may improve optical performance. The shock-absorbing layer 20 may be optically transparent. In some embodiments, the shock-absorbing layer 20 may be eliminated.

The cover window 30 may be disposed on the shock-absorbing layer 20. The cover window 30 serves to cover and protect the display panel 10. The cover window 30 may be made of a transparent material. The cover window 30 may include or may be formed of, for example, glass or plastic.

When the cover window 30 includes glass, the glass may be ultra thin glass (UTG) or thin glass. When the cover window 30 includes a plastic, the plastic may be, but is not limited to, a transparent polyimide. The cover window 30 may have flexibility and thus may be curved, bent, folded or rolled.

The cover window protection layer 40 may be disposed on the cover window 30. The cover window protection layer 40 may perform at least one of functions of anti-scattering when the cover window 30 is broken, shock absorption, anti-scratch, anti-fingerprint, and anti-glare. The cover window protection layer 40 may include or may be formed of a transparent polymer film. The cover window protection layer 40 may be eliminated.

It is, however, to be understood that the present disclosure is not limited thereto. A polymer film layer, a cushion layer, or a heat-dissipating member may be further disposed on the opposite side (lower side in the cross-sectional view) of the display panel 10 in the thickness direction (third direction DR3). In such case, the polymer film layer, the cushion layer, or the heat-dissipating member may include or may be provided with a through hole that physically penetrates each of them.

A hole area HLA may include or may be provided with at least one hole HLE. The hole area HLA may have, but is not limited to, a circular shape, an oval shape, a dumbbell shape, or a rectangular shape with convex shorter sides when viewed from the top. The hole area HLA may have other shapes such as a rectangle, a square, and other polygonal shapes. The hole HLE of the hole area HLA may also have a shape such as a circle and an ellipse when viewed from the top.

The hole HLE may include or may be provided with a through-hole HLE_TH that is physically penetrated. The through hole HLE_TH may physically penetrate the display panel 10. As the above-described layers are removed in the through-hole HLE_TH, the display panel 10 may have increased light transmittance at the through-hole HLE_TH compared to other regions of the display panel.

The cover window 30 and the cover window protection layer 40 may not be physically penetrated where they overlap the through hole HLE_TH. For example, the cover window 30 and the cover window protection layer 40 may have no hole connected to the through hole HLE_TH, and may cover the through hole HLE_TH. Since the cover window 30 and the cover window protection layer 40 themselves have high light transmittance, thereby maintaining high light transmittance without having holes penetrating the cover window 30 and the cover window protection layer 40. As the cover window 30 and the cover window protection layer 40 are not penetrated where the through-hole HLE_TH is formed, it may physically cover and protect the elements therebelow.

The first coupling member PSA1 may be physically penetrated where it overlaps the through hole HLE_TH, but the present disclosure is not limited thereto. When the first coupling member PSA1 is optically transparent, it may not be physically penetrated there. The second coupling member PSA2 and the third coupling member PSA3 may not be physically penetrated where they overlap the through hole HLE_TH. In such case, the second coupling member PSA2 and the third coupling member PSA3 may be optically transparent. For example, the through hole HLE_TH may not extend into the second coupling member PSA2 and the third coupling member PSA3, which are optically transparent. The second coupling member PSA2 and the third coupling member PSA3 may cover the through hole HLE_TH.

The display device 1 may further include a print layer IN. The print layer IN may be disposed on the shock-absorbing layer 20. The print layer IN may be disposed on a surface and/or the opposite surface of the shock-absorbing layer 20. It is, however, to be understood that the present disclosure is not limited thereto. The print layer IN may be disposed on one surface and/or the opposite surface of the cover window 30, or may be disposed on one surface and/or the opposite surface of the cover window protection layer 40. The print layer IN may be disposed in the hole area HLA. Although not shown in the drawings, the print layer IN may be disposed on the edge of the shock-absorbing layer 20. The print layer IN may be a light-blocking layer or a decorative layer that gives aesthetic effects.

The hole area HLA may further include an optical hole HLE_OP, which is an optically transmissive window, in addition to the through-hole HLE_TH. The optical hole HLE_OP may overlap the through-hole HLE_TH, and may be defined by a pattern of the print layer IN. The print layer IN may be disposed in a part of the hole area HLA and may serve to block the emission of light (e.g., light leakage) through the through-hole HLE_TH. The print layer IN of the hole area HLA may partially overlap the through-hole HLE_TH. For example, the inner surface of the print layer IN may further protrude inward from the inner wall of the through-holes HLE_TH. The print layer IN may be extended to the outer periphery of the hole area HLA, but the present disclosure is not limited thereto.

The shape of the optical hole HLE_OP may conform to the shape of the through hole HLE_TH when viewed from the top. In some embodiments, the optical hole HLE_OP and the through hole HLE_TH may be circular, and concentric to each other. The present disclosure is not limited thereto.

The display device 1 may further include an optical element OPS including a light-receiving unit. Examples of the optical element OPS including the light-receiving unit include a camera, a lens such as a condensing lens and a light path guide lens, an optical sensor such as an infrared sensor, an iris recognition sensor and an illuminance sensor, and the like. The optical element OPS may be disposed on the other side of the display panel 10 so that it overlaps with the hole area HLA. A part or all of the light-receiving unit of the optical element OPS may be located in the optical hole HLE_OP. Light from the outside of the display device 1 may pass through the shock-absorbing layer 20 surrounded by the print layer IN, the cover window 30 and the cover window protection layer 40, to be incident on the light-receiving unit via the through hole HLE_TH thereunder. As described above, when the cover window 30 exhibits a high transmittance, outside light may reach the light-receiving unit of the optical element OPS through the above-described optical path without significant loss.

Figure 7:
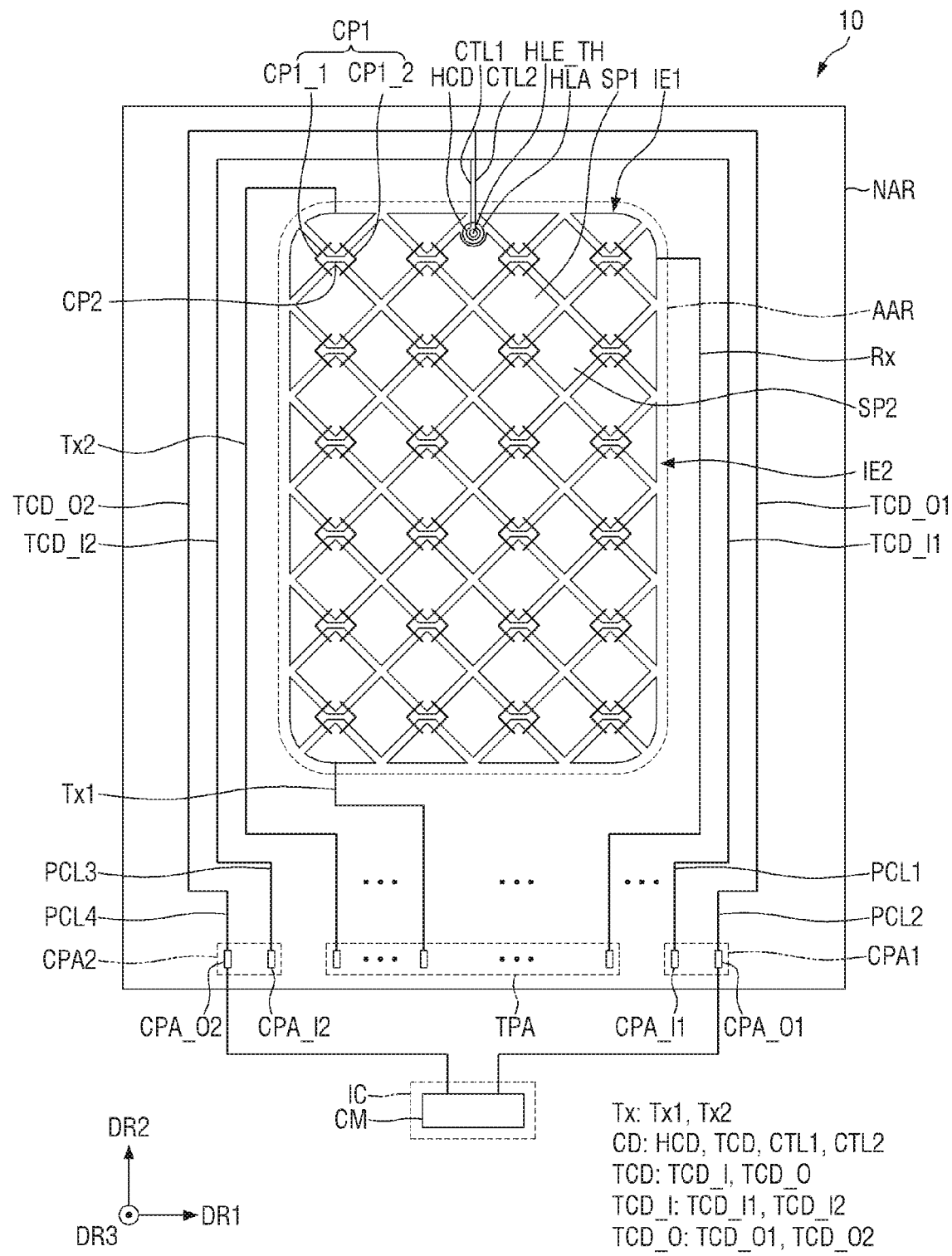
FIG. 7 is a schematic plan view of a touch layer according to an embodiment of the present disclosure.

FIG. 7 is a schematic plan view of a touch layer according to an embodiment of the present disclosure. FIG. 7 is an expanded view of the display panel 10.

Referring to FIG. 7, the touch layer (or touch member) may include a touch area located in the active area AAR and a non-touch area located in the non-active area NAR. Although the touch member is simplified and the non-touch area is exaggerated in FIG. 7 for convenience of illustration, the shapes of the touch area and the shape of the non-touch area may be substantially identical to those of the active area AAR and the non-active area NAR described above.

The touch area of the touch member may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. In this embodiment, the first sensing electrodes IE1 are driving electrodes, and the second sensing electrodes IE2 are sensing electrodes.

The first sensing electrodes IE1 may be extended in the second direction DR2. The first sensing electrodes IE1 may include a plurality of first sensor portions SP1 (or first touch sensor patterns) arranged in the second direction DR2, and first connecting portions CP1 (or first touch connecting patterns) electrically connecting between adjacent ones of the first sensor portions SP1. The plurality of first sensing electrodes IE1 may be arranged in the first direction DR1.

The second sensing electrodes IE2 may be extended in the first direction DR1. The second sensing electrodes IE2 may include a plurality of second sensor portions SP2 (or second touch sensor patterns) arranged in the first direction DR1, and second connecting portions CP2 (or second touch connecting patterns) electrically connecting between adjacent ones of the second sensor portions SP2. The plurality of second sensing electrodes IE2 may be arranged in the second direction DR2.

Although the four first sensing electrodes IE1 and the six second sensing electrodes IE2 are arranged in the drawing, it is to be understood that the numbers of the first sensing electrodes IE1 and the second sensing electrodes IE2 are not limited to the above numerical values.

At least some of the first sensor portions SP1 and the second sensor portions SP2 may have a diamond shape. Some of the first sensor portions SP1 and the second sensor portions SP2 may have a truncated diamond shape. For example, all of the first sensor portions SP1 and the second parts SP2 except the first and last ones in the extension direction may have a diamond shape, and each of the first and last ones in the extension direction may have a triangle shape obtained by cutting the diamond shape. The first sensor portions SP1 and the second sensor portions SP2 in the diamond shape may have substantially the same size and shape. The first sensor portions SP1 and the second sensor portions SP2 in the triangle shape may have substantially the same size and shape. It is, however, to be understood that the present disclosure is not limited thereto. The first sensor portions SP1 and the second sensor portions SP2 may have various shapes and sizes.

The first sensor portions SP1 of the first sensing electrodes IE1 and the second sensor portions SP2 of the second sensing electrodes IE2 may each include a planar pattern or a mesh pattern. It is, however, to be understood that the present disclosure is not limited thereto. The first sensor portions SP1 and the second sensor portions SP2 may be formed in various shapes.

Figure 8:
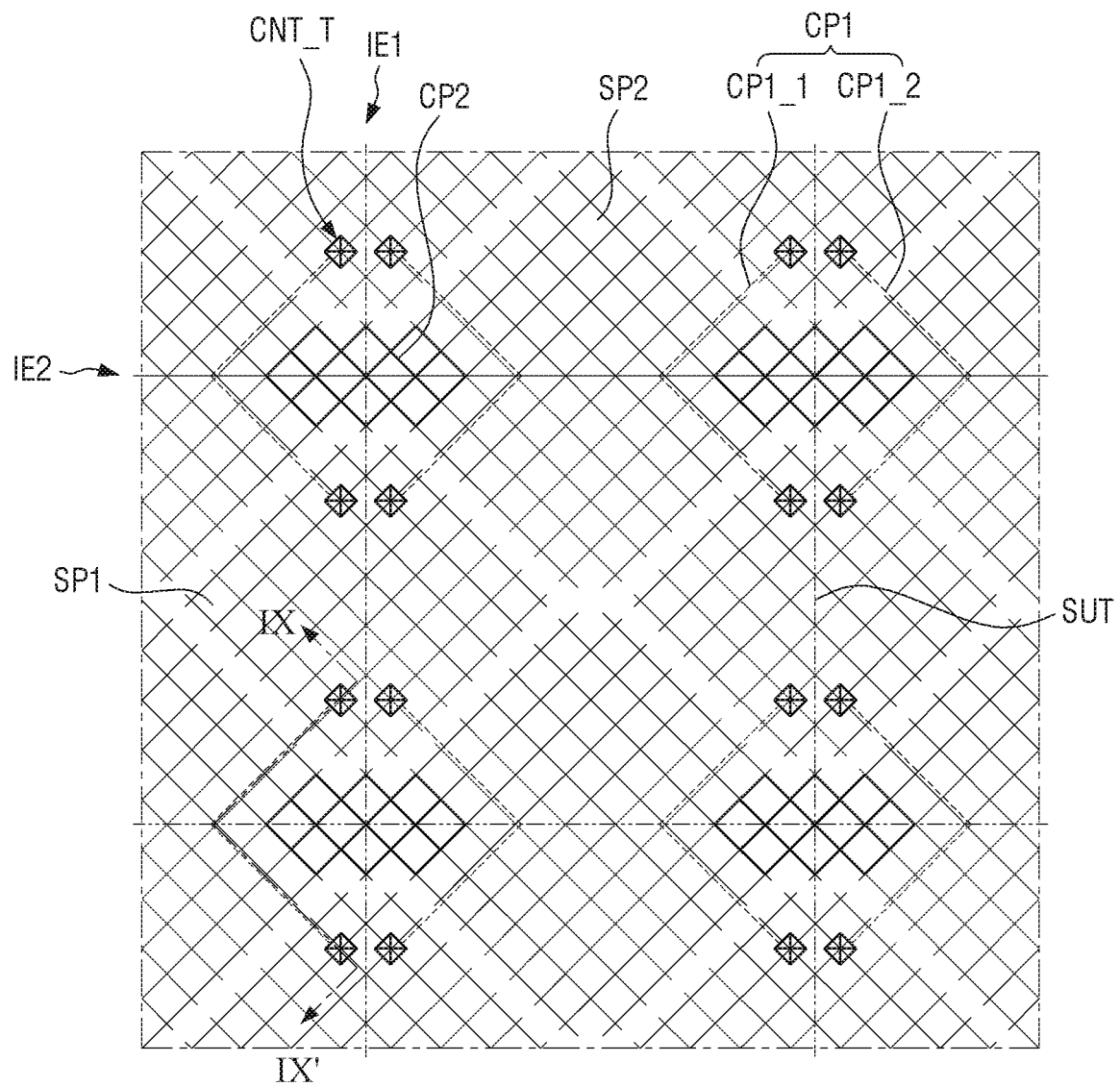
FIG. 8 is an enlarged view of a part of the touch area of FIG. 7 according to an embodiment of the present disclosure.
Figure 8:
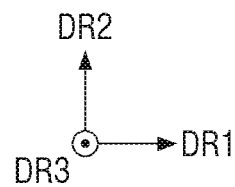
Figure 9:
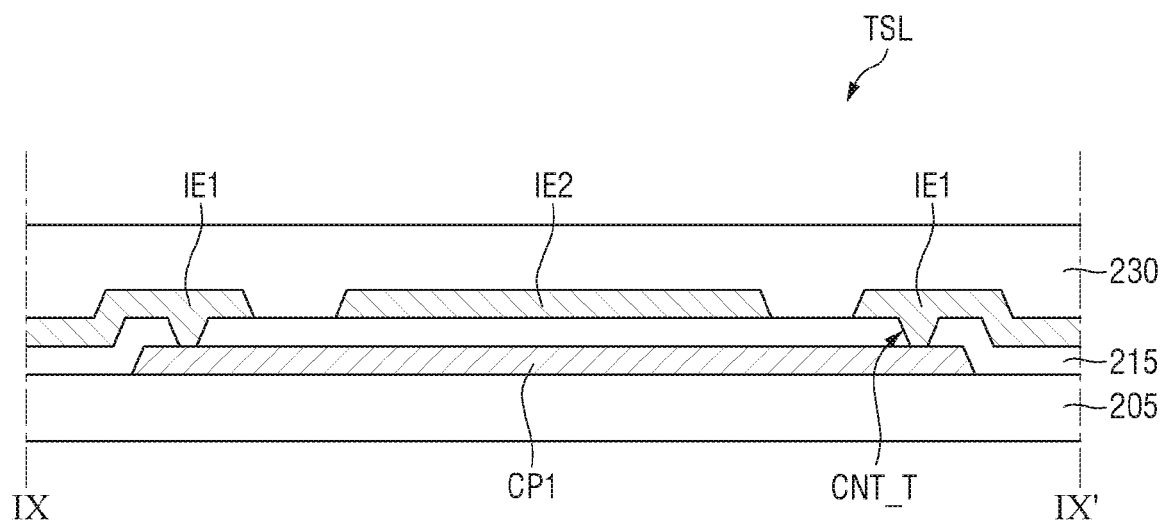
FIG. 9 is a cross-sectional view taken along line IX-IX' of FIG. 8 according to an embodiment of the present disclosure.

When the first sensor portions SP1 and the second sensor portions SP2 include a planar pattern, the first sensor portions SP1 and the second sensor portions SP2 may be formed as a transparent conductive layer. When the first sensor portions SP1 and the second sensor portions SP2 include a mesh pattern disposed along the non-emission areas as illustrated in FIGS. 8 and 9, it is possible to employ an opaque, low-resistance metal without interfering with the propagation of the emitted light. In the following description, the first sensor portions SP1 and the second sensor portions SP2 each include a mesh pattern. It is, however, to be understood that the present disclosure is not limited thereto.

Each of the first connecting portions CP1 may connect a vertex of the diamond or triangle shape of a first sensor portion SP1 with that of an adjacent first sensor portion SP1. Each of the second connecting portions CP2 may connect a vertex of the diamond or triangle shape of a second sensor portion SP2 with that of an adjacent second sensor portion SP2. The width of the first connecting portions CP1 and the second connecting portions CP2 may be smaller than the width of the first sensor portions SP1 and the second sensor portions SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer disposed on a different layer at the intersections. The first sensing electrodes IE1 may be insulated from the second sensing electrodes IE2. The first sensing electrodes IE1 may be connected to one another by the first connecting portions CP1, and the second sensing electrodes IE2 may be connected to one another by the second connecting portions CP2, so that they may be insulated from each other and may intersect each other. To implement such arrangements of the first sensing electrodes IE1 and the second sensing electrodes IE2, the first connecting portions CP1 and/or the second connecting portions CP2 may be located on a different layer from the first sensing electrode IE1 and the second sensing electrode IE2. For example, with the first connecting portions CP1 under the second sensing electrodes IE2, the first sensing electrodes IE1 and the second sensing electrodes IE2 may be disposed on the same layer (e.g., a first touch insulating layer 215 of FIG. 9) in a mesh shape and may be insulated from each other.

For example, the first sensor portions SP1 of the first sensing electrodes IE1 and the second sensor portions SP2 of the second sensing electrodes IE2 may be formed as a conductive layer located on the same layer, and the first sensor portions SP1 and the second sensor SP2 may neither intersect nor overlap each other. The adjacent ones of the first sensor portions SP1 and second sensor portions SP2 may be physically separated from each other.

The second connecting portions CP2 may be formed as the same conductive layer as the second sensor portions SP2 and may connect the adjacent ones of the second sensor portions SP2. A first sensor portion SP1 of a first sensing electrode IE1 is physically separated from an adjacent sensor portion SP1 thereof with respect to the area where a second connecting portion CP2 passes. The first connecting portions CP1 connecting the first sensor portions SP1 with one another may be formed as a different conductive layer from the first sensor portions SP1 and may traverse the area of the second sensing electrodes IE2. Each of the first connecting portions CP1 may be electrically connected to the respective first sensor portions SP1 by a contact.

There may be more than one first connecting portions CP1. For example, although not limited thereto, each of the first connecting portions CP1 may include a first connecting portion CP1_1 (or a first sub-connecting portion) which overlaps and passes an adjacent second sensing electrode IE2 on one side, and another first connecting portion CP1_2 (or a second sub-connecting portion) which overlaps and passes another adjacent second sensing electrode IE2 on the opposite side. As more than one first connecting portions CP1 connect between two adjacent ones of the first sensor portions SP1, it is possible to prevent disconnection of the first sensing electrodes IE1 even if any of the first connecting portions CP1 is broken by static electricity or the like.

The first sensor portions SP1 and the second sensor portions SP2 adjacent to each other may form a sensing unit SUT (see FIG. 8). For example, halves of two adjacent first sensor portions SP1 and halves of two adjacent second sensor portions SP2 may form a square or a rectangle, with respect to the intersection between the first sensing electrodes IE1 and the second sensing electrodes IE2. The area defined by the halves of the adjacent two first sensor portions SP1 and halves of the two adjacent second sensor portions SP2 may be a sensing unit SUT. A plurality of sensing units SUT may be arranged in row and column directions.

In each of the sensing units SUT, the capacitance value between the adjacent first sensor portions SP1 and the second sensor portions SP2 is measured to determine whether or not a touch input is made, and if so, the position may be obtained as touch input coordinates. For example, a touch may be sensed by, for example, measuring mutual capacitance.

Each unit sensing region SUT may be larger than the size of a pixel. For example, each unit sensing region SUT may have an area equal to the area occupied by a plurality of pixels. The length of a side of the unit sensing area SUT may be in the range of, but is not limited to, 4 to 5 mm.

The first sensing portions SP1, the second sensing portions SP2, the first connecting portions CP1 and the second connecting portions CP2 may not be disposed in at least a part of the hole area HLA. The first sensing portions SP1, the second sensing portions SP2, the first connecting portions CP1 and the second connecting portions CP2 may not be disposed in the through hole HLE_TH.

The shapes and sizes of the first sensing portions SP1 and the second sensing portions SP2 disposed around the hole area HLA may be different from the shapes and sizes of the other first sensing portions SP1 and second sensing portions SP2. Although not limited thereto, the first sensing portions SP1 and the second sensing portions SP2 disposed around the hole area HLA may have a smaller size or may be removed partially.

In the vicinity of the hole area HLA, the first sensing portions SP1 and the first connecting portions CP1 electrically connecting between the first sensing portions SP1 may be extended around the hole area HLA. In addition, the second connecting portion CP2 electrically connecting between the second sensing portions SP2 may be extended around the hole area HLA.

The touch member may further include a plurality of touch signal lines. The plurality of touch signal lines may be disposed on the outer side of the touch area. The plurality of touch signal lines may be disposed in the non-active area NAR (see FIG. 1). The touch signal lines may be extended from a touch signal line pad area TPA located in the subsidiary region SR (see FIG. 1) to the non-active area NAR (see FIG. 1) of the main region MR (see FIG. 1) through the bending region BR (see FIG. 1).

The touch signal lines include a touch driving line Tx and a touch sensing line Rx. There may be more than one touch driving lines Tx and more than one touch sensing lines Rx. In the example shown in FIG. 7, one touch driving line Tx and one touch sensing line Rx are connected to the first sensing electrode IE1 and the second sensing electrode IE2, respectively.

The touch driving line Tx is connected to the first sensing electrode IE1. The touch driving line Tx may be connected to each of the first sensing electrodes IE1. In an embodiment, a plurality of touch driving lines Tx may be connected to a single first sensing electrode IE1. For example, the touch driving lines Tx may include a first touch driving line Tx1 connected to the lower end of the first sensing electrode IE1, and a second touch driving line Tx2 connected to the upper end of the first sensing electrode IE1. The first touch driving line Tx1 may be extended from the touch signal line pad area TPA in the second direction DR2 and may be connected to the lower end of the first sensing electrode IE1. The second touch driving line Tx2 may be extended from the touch signal line pad area TPA in the second direction DR2 and may be extended around the left edge of the touch area to be connected to the upper ends of the first sensing electrode IE1.

The touch sensing line Rx is connected to the second sensing electrode IE2. The touch sensing line Rx may be connected to each of the second sensing electrodes IE2. In an embodiment, a single touch sensing line Rx may be connected to a single second sensing electrode IE2. The touch sensing line Rx may be extended from the touch signal line pad area TPA in the second direction DR2 and may be extended to the right edge of the touch area to be connected to the right end of the second sensing electrode IE2.

The plurality of touch signal lines may further include a touch ground line and a touch antistatic line. The touch antistatic line may be disposed on the outermost position of the touch signal lines. There may be more than one touch antistatic lines. The touch antistatic lines may surround the touch area and the signal lines in a ring shape. The touch ground line may be disposed between the signal lines.

FIG. 8 is an enlarged view of a part of the touch area of FIG. 7. FIG. 9 is a cross-sectional view taken along line IX-IX' of FIG. 8.

Referring to FIGS. 7 to 9, the touch member may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

For example, the first touch conductive layer 210 is disposed on the base layer 205. The first touch conductive layer 210 is covered by the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 covers and protects the second touch conductive layer 220.

The base layer 205 may include or may be formed of an inorganic insulating material. For example, the base layer 205 may include or may be formed of a silicon nitride layer, a silicon oxynitride layer, a silicon oxide layer, a titanium oxide layer, or an aluminum oxide layer. In some embodiments, the base layer 205 may be replaced with a second inorganic encapsulation film 193 forming a thin encapsulation layer to be described later.

Each of the first touch conductive layer 210 and the second touch conductive layer 220 may include or may be formed of a metal or a transparent conductive layer. The metal may include aluminum, titanium, copper, molybdenum, silver, or an alloy thereof. The transparent conductive layer may include or may be formed of a transparent conductive oxide such as indium tin oxide (ITO), indium zinc oxide (IZO), zinc oxide (ZnO) and indium tin zinc oxide (ITZO), a conductive polymer such as PEDOT, metal nanowire, and graphene. As described above, when the first touch conductive layer 210 and the second touch conductive layer 220 are disposed on the non-emission area, they do not interfere with the propagation of the emitted light. In some embodiment, the first touch conductive layer 210 and the second touch conductive layer 220 may include or may be formed of an opaque, low-resistance metal. For example, the first touch conductive layer 210 and the second touch conductive layer 220 that are disposed on the non-emission area and are opaque may not block the propagation of the emitted light.

The first touch conductive layer 210 and/or the second touch conductive layer 220 may be a multi-layered conductive layer. For example, the first touch conductive layer 210 and/or the second touch conductive layer 220 may have a three-layer structure of titanium/aluminum/titanium.

In an embodiment, the first connecting portions CP1 may be formed as the first touch conductive layer 210, and the first sensor portions SP1, the second sensor portions SP2 and the second connecting portions CP2 may be formed as the second touch conductive layer 220. For example, the first touch conductive layer 210 may include a first connecting portion CP1, and the second touch conductive layer 220 may include the first sensor portion SP1, the second sensor portion SP2, and the second connecting portion CP2. It is, however, to be understood that the present disclosure is not limited thereto. For example, the first connecting portions CP1 may be formed as the second touch conductive layer 220, and the sensor portions SP1 and SP2 and the second connecting portions CP2 may be formed as the first touch conductive layer 210. The touch signal lines may be formed as either the first touch conductive layer 210 or the second touch conductive layer 220. Alternatively, the touch signal lines may be formed as the first touch conductive layer 210 and the second touch conductive layer 220 connected by a contact. Besides, the touch conductive layers forming the elements of the sensing electrodes and the signal lines may be modified in various ways.

The first touch insulating layer 215 and the second touch insulating layer 230 may include or may be formed of an inorganic material or an organic material. In an embodiment, the first touch insulating layer 215 or the second touch insulating layer 230 may include or may be formed of an inorganic material and the other may include or may be formed of an organic material. According to an embodiment of the present disclosure, the first touch insulating layer 215 may include or may be formed of a silicon nitride layer, a silicon oxynitride layer, a silicon oxide layer, a titanium oxide layer, or an aluminum oxide layer. The second touch insulating layer 230 include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin. When the second touch insulating layer 230 includes an organic material, it may have a flat upper surface despite the level differences thereunder.

The first touch insulating layer 215 may include a contact hole CNT_T. The first touch conductive layer 210 (e.g., the first connecting portion CP1) and a part of the second touch conductive layer 220 (e.g., the first sensor portion SP1) may be electrically to each other through the contact hole CNT_T. The first sensor portions SP1 of the first sensing electrodes IE1 separated by the second sensing electrodes IE2 may be electrically connected with each other by the first touch conductive layer 210 (e.g., the first connecting portions CP1).

In addition, although not shown in the drawings, an insulating layer may be further disposed on the second touch conductive layer 220. The insulating layer may include or may be formed of an inorganic material or an organic material. When the insulating layer includes an organic material, it may have a flat upper surface despite the level differences thereunder.

Figure 10:
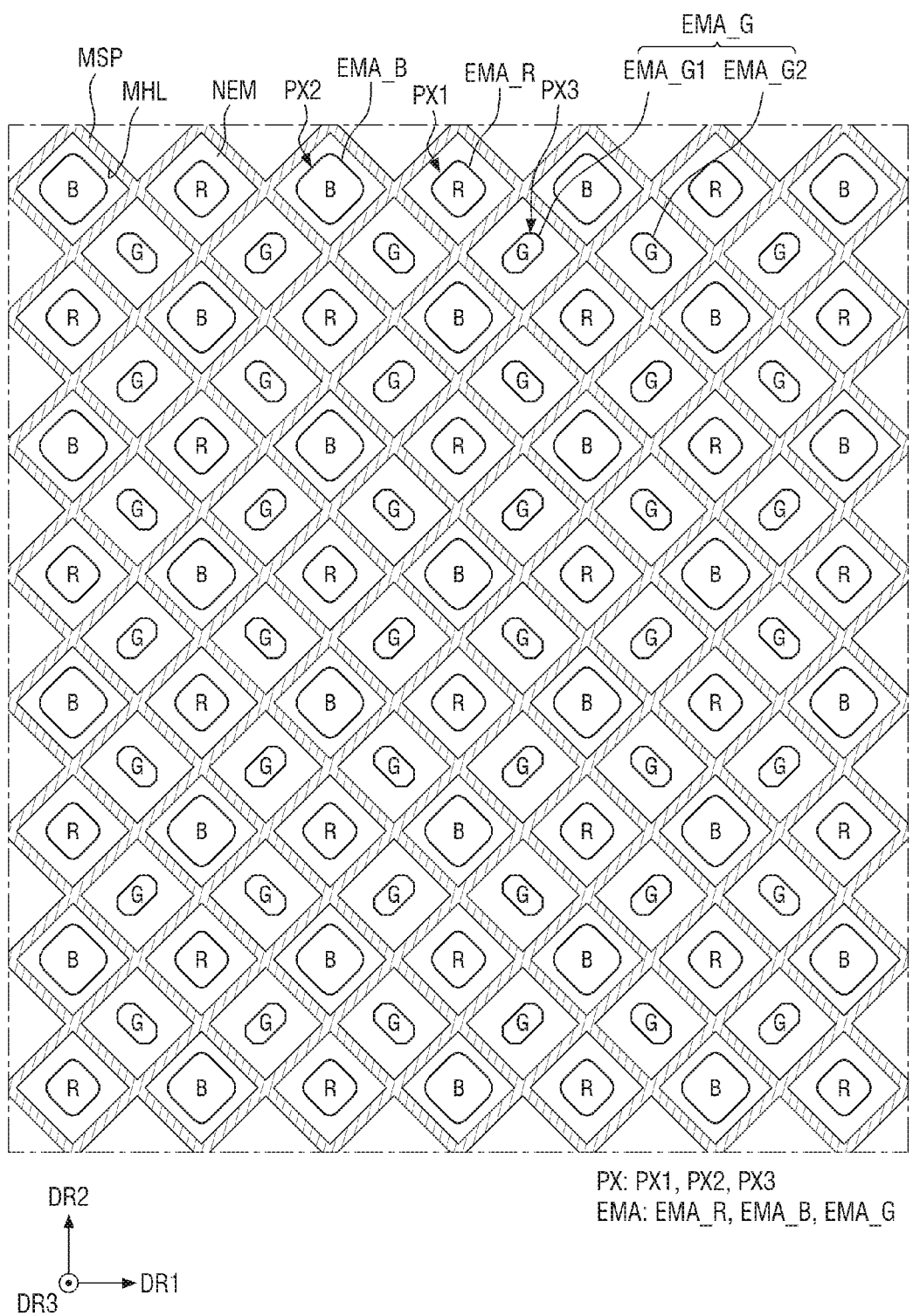
FIG. 10 is a diagram showing the relative arrangement relationship between the pixels and the touch member in a mesh pattern in the display area according to an embodiment of the present disclosure.

FIG. 10 is a diagram showing the relative arrangement relationship between the pixels and the touch member in a mesh pattern in the display area according to an embodiment of the present disclosure.

Referring to FIG. 10, the display area of the active area AAR includes a plurality of pixels PX: PX1, PX2 and PX3. Each of the pixels includes an emission area EMA: EMA_R, EMA_B and EMA_G. The emission area EMA overlaps with an opening of a bank layer 126 (see FIG. 13) and may be defined thereby. A non-emission area NEM is disposed between the emission area EMA of a pixel and the emission area EMA of another pixel. The non-emission area NEM overlaps with the bank layer 126 (see FIG. 13) and may be defined thereby. The non-emission area NEM may surround the emission area EMA. The non-emission area NEM has a lattice shape or a mesh shape arranged along the diagonal directions intersecting with the first direction DR1 and the second direction DR2 when viewed from the top.

A mesh pattern MSP is disposed in the non-emission area NEM. The mesh pattern MSP may be substantially identical to at least one of the first touch conductive layer 210 and the second touch conductive layer 220 described above with reference to FIGS. 7 to 9.

The pixels PX may include a first pixel PX1, a second pixel PX2 and a third pixel PX3. Although not limited thereto, the first pixel PX1 may emit red light, the second pixel PX2 may emit blue light, and the third pixel PX3 may emit green light.

The shape of the emission area EMA of each of the pixels PX may be an octagon, or a square or diamond with rounded corners. It is, however, to be understood that the present disclosure is not limited thereto. The shape of each emission area EMA may be a circle, a diamond, or other polygons with or without rounded corners.

In an embodiment, the emission area EMA_R of the first pixel PX1 and the emission area EMA_B of the second pixel PX2 may have a similar shape such as a diamond shape with rounded corners. The emission area EMA_B of the second pixel PX2 may be larger than the emission area EMA_R of the first pixel PX1.

The emission area EMA_G of the third pixel PX3 may be smaller than the emission area EMA_R of the first pixel PX1. The emission area EMA_G of the third pixel px3 may have an octagon shape that is inclined in a diagonal direction and has the maximum width in the inclined direction. The third pixels PX3 may include a third pixel PX3 in which an emission area EMA_G1 is inclined in a first diagonal direction, and a third pixel PX3 in which an emission area EMA_G2 is inclined in a second diagonal direction.

The color pixels may be arranged in various ways. In an embodiment, the first pixels PX1 and the second pixels PX2 may be alternately arranged in the first direction DR1 to form a first row, and the third pixels PX3 may be arranged in the first direction DR1 to form a second row next to the first row. The pixels belonging to the second row (the third pixels PX3) may be arranged to be staggered with the pixels belonging to the first row. In the second row, the third pixels PX3 that are inclined in the first diagonal direction and the third pixels PX3 that are inclined in the second diagonal direction may be alternately arranged in the first direction DR1. The number of the third pixels PX3 belonging to the second row may be twice the number of the first pixels PX1 or the number of the second pixels PX2 belonging to the first row.

In a third row, the color pixels of the same colors as those of the first row may be arranged in the reversed order. For example, the second pixel PX2 may be disposed in the third row of the same column as the first pixel PX1 in the first row, and the first pixel PX1 may be disposed in the third row of the same column as the second pixel PX2 in the first row. In the fourth row, the third pixels PX3 are arranged like the second row but to be arranged in the reversed order in view of the shapes inclined with respect to the diagonal directions. For example, the third pixel PX3 inclined in the second diagonal direction may be disposed in the fourth row of the same column as the third pixel PX3 inclined in the first diagonal direction in the second row, and the third pixel PX3 inclined in the first diagonal direction may be disposed in the fourth row of the same column as the third pixel PX3 inclined in the second diagonal direction in the second row.

The arrangement of the first to fourth rows may be repeated along the second direction DR2. It is to be understood that the arrangement of the pixels is not limited to the above example.

The mesh pattern MSP may be disposed along the boundaries of the pixels PX in the non-emission area NEM. The mesh pattern MSP may not overlap the emission area EMA. The width of the mesh pattern MSP may be smaller than the width of the non-emission area NEM. In an embodiment, mesh holes MHL exposed by the mesh pattern MSP may have a substantially diamond shape. The mesh holes MHL may have the same size. Alternatively, the mesh holes MHL may have different sizes either depending on the size of the emission area EMA exposed via the mesh holes MHL or regardless of it. Although a single mesh hole MHL is formed in a single emission area EMA in the drawing, this is merely illustrative. In some implementations, a single mesh hole MHL may be formed across two or more emission areas EMA.

Figure 11:
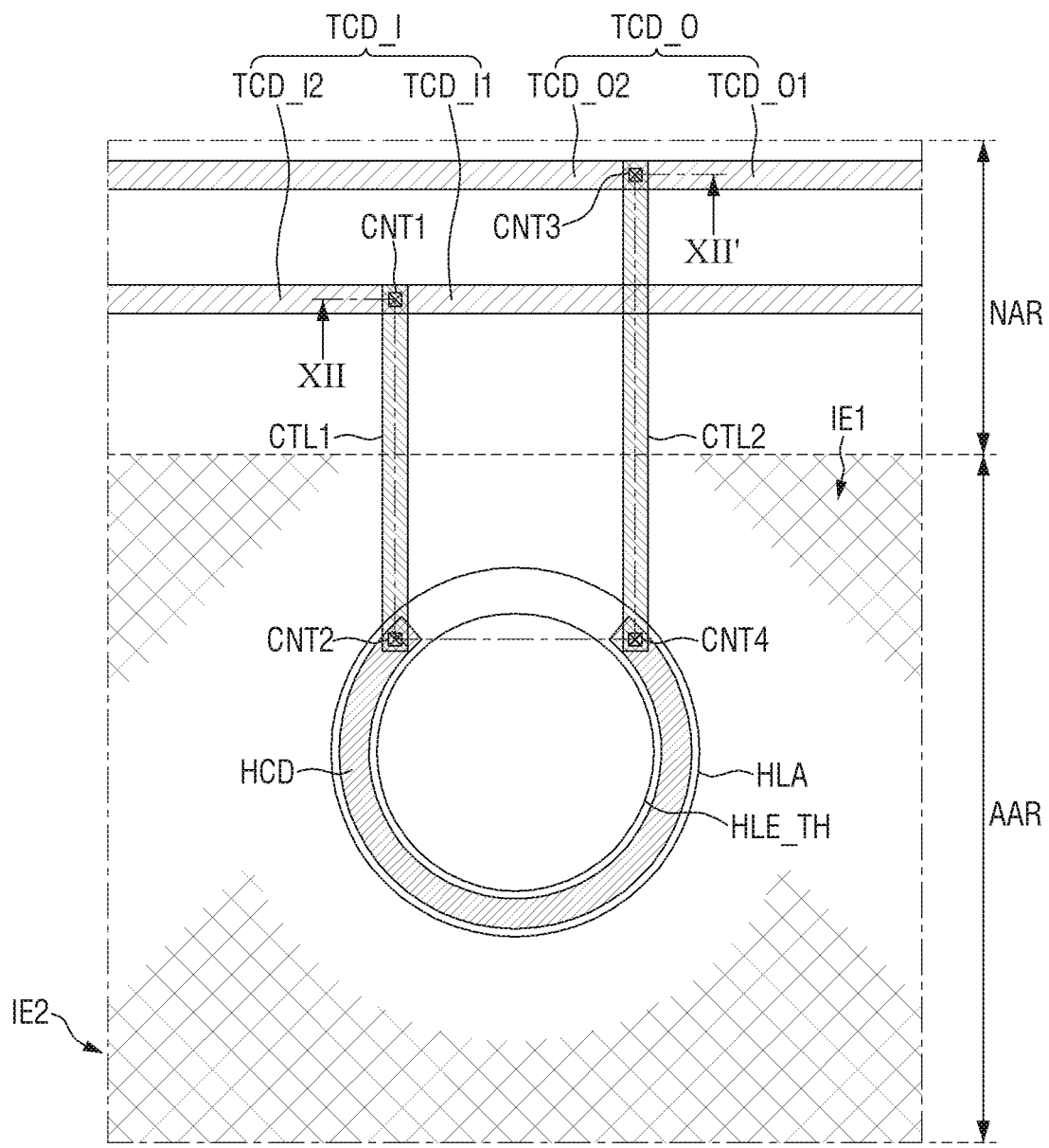
FIG. 11 is an enlarged view of the periphery of the hole area of FIG. 7 according to an embodiment of the present disclosure.
Figure 12:
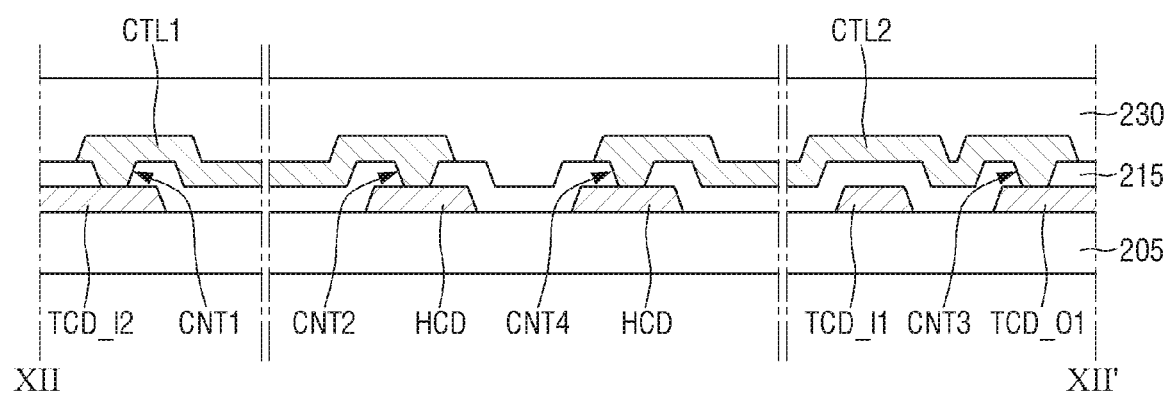
FIG. 12 is a cross-sectional view taken along line XII-XII' of FIG. 11 according to an embodiment of the present disclosure.

FIG. 11 is an enlarged view of the periphery of the hole area of FIG. 7. FIG. 12 is a cross-sectional view taken along line XII-XII' of FIG. 11.

Referring to FIGS. 7, 11 and 12, the display device 1 may further include crack detection lines CD capable of detecting cracks around the through hole HLE_TH and the edge of the display device 1. The crack detection lines CD may include a hole crack detection line HCD, edge crack detection lines TCD, first and second connection lines CTL1 and CTL2 that electrically connects the hole crack detection line HCD with the edge crack detection lines TCD. The hole crack detection line HCD and the edge crack detection lines TCD may be formed as the first touch conductive layer 210, and the first and second connection lines CTL1 and CTL2 may be formed as the second touch conductive layer 220. It is, however, to be understood that the present disclosure is not limited thereto.

The hole crack detection line HCD may be disposed around the through hole HLE_TH. The hole crack detection line HCD may be disposed in the hole area HLA, but the present disclosure is not limited thereto. It may be disposed outside the hole area HLA or may be partially disposed in the hole area HLA. The hole crack detection line HCD may have an open-curved shape when viewed from the top and may be disposed to partially surround the through hole HLE_TH.

The edge crack detection lines TCD may be disposed on the outer side of the touch area. The edge crack detection lines TCD may be disposed on the outer side of the plurality of touch signal lines, but the present disclosure is not limited thereto. The edge crack detection lines TCD may be disposed in the non-active area NAR (see FIG. 1). The edge crack detection lines TCD may be extended from crack detection pad areas CPA1 and CPA2 located in the subsidiary region SR (see FIG. 1) to the non-active area NAR (see FIG. 1) of the main region MR (see FIG. 1) through the bending region BR (see FIG. 1). The edge crack detection lines TCD may be disposed in the edge area of the display device 1 or the display panel 10.

The edge crack detection lines TCD may include an input line TCD_I and an output line TCD_O. The output line TCD_O may be disposed on the outer side of the input line TCD_I. The input line TCD_I and the output line TCD_O may at least partially surround the active area AAR when viewed from the top. For example, each of the input line TCD_I and the output line TCD_O may be disposed on one side and the opposite side of the active area AAR in the first direction DR1 and one side thereof in the second direction DR2, except the opposite side of the active area AAR in the second direction DR2. The input line TCD_I and the output line TCD_O disposed on one side and the opposite side of the active area AAR in the first direction DR1 may be extended in the second direction DR2, and the input line TCD_I and the output line TCD_O disposed on one side and a part of the opposite side of the active area AAR in the second direction DR2 may be extended in the first direction DR1. As will be described later, the direction in which the input line TCD_I and the output line TCD_O are extended may be substantially identical to the direction in which an edge dam structure DAM_T (i.e., a first dam structure; see FIG. 14) is extended.

The display panel 10 may further include a first crack detection pad area CPA1 including a pad CPA_I1 of a first input line TCD_I1 and a pad CPA_O1 of a first output line TCD_O1, a second crack detection pad area CPA2 including a pad CPA_I2 of a second input line TCD_I2 and a pad CPA_O2 of a second output line TCD_O2, and pad connection lines PCL1, PCL2, PCL3 and PCL4.

One ends of the input line TCD_I and the output line TCD_O may be connected to the first crack detection pad area CPA1 through the first pad connection line PCL1 and the second pad connection line PCL2, respectively, and the opposite ends thereof may be connected to the second crack detection pad area CPA2 through the third pad connection line PCL3 and the fourth pad connection line PCL4, respectively. As will be described later, the direction in which the pad connection lines PCL1, PCL2, PCL3 and PCL4 are extended may intersect the direction in which the adjacent edge dam structure DAM_T (see FIG. 14) is extended.

The first crack detection pad area CPA1 and the second crack detection pad area CPA2 may be disposed on one side and the opposite side of the touch signal line pad area TPA in the first direction DR1, but the present disclosure is not limited thereto. Each of the input line TCD_I and the output line TCD_O may be extended from the first crack detection pad area CPA1 in the second direction DR2 and may be extended around the active area AAR in the counterclockwise direction to reach the second crack detection pad area CPA2.

The input line TCD_I may include a first input line TCD_I1 and a second input line TCD_I2, and the output line TCD_O may include a first output line TCD_O1 and a second output line TCD_O2.

The first input line TCD_I1 may be located on the right side (one side of the first direction DR1) with respect to the part where the input line TCD_I is connected to the first connection line CTL1, and may be extended to the first crack detection pad area CPA1 to be connected to the pad CPA_I1 of the first input line TCD_I1. The second input line TCD_I2 may be located on the left side (the opposite side of the first direction DR1) with respect to the part where the input line TCD_I is connected to the first connection line CTL1, and may be extended to the second crack detection pad area CPA2 to be connected to the pad CPA_I1 of the second input line TCD_I2. The first output line TCD_O1 may be located on the right side (one side of the first direction DR1) with respect to the part where the output line TCD_O is connected to the second connection line CTL2, and may be extended to the first crack detection pad area CPA1 to be connected to the pad CPA_O1 of the first output line TCD_O1. The second output line TCD_O2 may be located on the left side (the opposite side of the first direction DR1) with respect to the part where the output line TCD_O is connected to the second connection line CTL2, and may be extended to the second crack detection pad area CPA2 to be connected to the pad CPA_O2 of the second output line TCD_O2.

The first connection line CTL1 may electrically connect the input line TCD_I with the hole crack detection line HCD, and the second connection line CTL2 may electrically connect the output line TCD_O with the hole crack detection line HCD. The input line TCD_I may be connected to one end of the hole crack detection line HCD through the first connection line CTL1, and the output line TCD_O may be connected to the other end of the hole crack detection line HCD through the second connection line CTL2. The first connection line CTL1 and the second connection line CTL2 may be extended in the second direction DR2, but the present disclosure is not limited thereto.

The input line TCD_I and the first connection line CTL1 may at least partially overlap each other, and may be electrically connected to each other where they overlap each other through a contact hole CNT1 that penetrates the first touch insulating layer 215 to expose the input line TCD_I. For example, the input line TCD_I and the first connection line CTL1 may contact each other at the contact hole CNT1. The hole crack detection line HCD and the first connection line CTL1 may at least partially overlap each other, and may be electrically connected to each other where the hole crack detection line HCD and the first connection line CTL1 overlap each other through a contact hole CNT2 that penetrates the first touch insulating layer 215 to expose the hole crack detection line HCD. For example, the hole crack detection line HCD and the first connection line CTL1 may contact each other via the contact hole CNT2. It is, however, to be understood that the present disclosure is not limited thereto. The first connection line CTL1 may be formed integrally with the input line TCD_I and the hole crack detection line HCD.

The output line TCD_O and the second connection line CTL2 may at least partially overlap each other, and may be electrically connected to each other where the output line TCD_O and the second connection line CTL2 overlap each other through a contact hole CNT3 that penetrates the first touch insulating layer 215 to expose the output line TCD_O. For example, the output line TCD_O and the second connection line CTL2 may contact each other through the contact hole CNT3. The hole crack detection line HCD and the second connection line CTL2 may at least partially overlap each other, and may be electrically connected to each other where the hole crack detection line HCD and the second connection line CTL2 overlap each other through a contact hole CNT4 that penetrates the first touch insulating layer 215 to expose the hole crack detection line HCD. For example, the hole crack detection line HCD and the second connection line CTL2 may contact each other through the contact hole CNT4. Accordingly, even though the second connection line CTL2 and the input line TCD_I overlap each other and cross each other, the second connection line CTL2 and the input line TCD_I may be electrically insulated from each other by the first touch insulation layer 215.

It is possible to determine whether there is a crack around the through hole HLE_TH as well as around the edge area of the display device 1 (see FIG. 1) or the display panel 10 based on the crack detection lines CD. For example, it is possible to determine whether there is a crack around the through hole HLE_TH based on the hole crack detection line HCD, and it is possible to determine whether there is a crack around the edge area of the display device 1 (see FIG. 1) or the display panel 10 based on the edge crack detection lines TCD. If it is determined that there is a crack, the location of the crack may be identified.

When a signal is applied to the pads CPA_I1 and CPA_I2 of the input lines TCD_I: TCD_I1 and TCD_I2 disposed on at least one of the first crack detection pad area CPA1 and the second crack detection pad area CPA2, the signal may be transmitted to the pads CPA_O1 and CPA_O2 of the output lines TCD_O: TCD_O1 and TCD_O2 disposed in the first crack detection pad area CPA1 and the second crack detection pad area CPA2 via the input line TCD_I, the first connection line CTL1, the hole crack detection line HCD, the second connection line CTL2 and the output line TCD_O.

If there is no crack around the through hole HLE_TH or the edge area of the display device 1 (see FIG. 1) or the display panel 10, the signal applied to the pads CPA_I1 and CPA_I2 of the input lines TCD_I: TCD_I1 and TCD_I2 may be transmitted to the pad CPA_O1 of the first output line TCD_O1 and the pad CPA_O2 of the second output line TCD_O2.

If a crack occurs around the through hole HLE_TH, the signal applied to the pads CPA_I1 and CPA_I2 of the input lines TCD_I: TCD_I1 and TCD_I2 may not be transmitted to the pads CPA_O1 and CPA_O2 of the first output line TCD_O1 and the second output line TCD_O2.

If a crack occurs in the right hand of the edge area of the display device 1 (see FIG. 1) or the display panel 10, the signal applied to the pads CPA_I1 and CPA_I2 of the input lines TCD_I: TCD_I1 and TCD_I2 may be transmitted to the pad CPA_O2 of the second output line TCD_O2 but not to the pad CPA_O1 of the first output line TCD_O1.

If a crack occurs in the left hand of the edge area of the display device 1 (see FIG. 1) or the display panel 10, the signal applied to the pads CPA_I1 and CPA_I2 of the input lines TCD_I: TCD_I1 and TCD_I2 may be transmitted to the pad CPA_O1 of the first output line TCD_O1 but not to the pad CPA_O2 of the second output line TCD_O2.

Herein, the right hand of the edge area of the display device 1 (see FIG. 1) or the display panel 10 refers to the area located on the right side (one side in the second direction DR2) of an imaginary line extended in the second direction DR2 and passing through the through hole HLE_TH. The left hand of the edge area of the display device 1 (see FIG. 1) or the display panel 10 refers to the area located on the left side (the opposite side in the second direction DR2) of the imaginary line extended in the second direction DR2 and passing through the through hole HLE_TH.

The display panel 10 may further include a crack determination member CM (i.e., a crack detection member). The crack determination member CM may be disposed in the driving chip IC or implemented as a part of the driving chip IC, but the present disclosure is not limited thereto. The crack determination member CM may be implemented as a separated element. The crack determination member CM may be electrically connected to the pad CPA_O1 of the first output line TCD_O1 and the pad CPA_O2 of the second output line TCD_O2. The crack determination member CM may determine whether there is a crack by applying a signal applied to the pads CPA_I1 and CPA_I2 of the input lines TCD_I: TCD_I1 and TCD_I2 and by determining if the signal is transmitted to the pad CPA_O1 of the first output line TCD_O1 and the pad CPA_O2 of the second output line TCD_O2 and measuring the intensity or the like of the signal if so.

It is possible to determine whether there is a crack and if so, the location of the crack based on whether the signal applied to the pads of the input lines TCD_I: TCD_I1 and TCD_I2 is transmitted to the pad of the first output line TCD_O1 and the pad of the second output line TCD_O2. In addition, as the output line TCD_O is disposed on the outer side of the input line TCD_I, it is possible to determine whether there is a crack and the location of the crack if so even when a crack occurs first at a location where the output line TCD_O is disposed or when no crack occurs at a location where the input line TCD_I is disposed and a crack occurs only at a location where the output line TCD_O is disposed.

In addition, when the display device 1 (see FIG. 3) is bent at an edge of one side surface, a crack may occur from the outer side of the bent edge and may propagate into the inner side of the display device 1 (see FIG. 3). In such case, as the output line TCD_O is disposed on the outer side of the input line TCD_I, it is possible to determine whether there is a crack in the bent area.

Moreover, as the hole crack detection line HCD and the edge crack detection lines TCD are formed as the same conductive layer, and the input line TCD_I and the output line TCD_O are formed as the same conductive layer, no additional process is required for forming the hole crack detection line HCD and the edge crack detection lines TCD, and the input line TCD_I and the output line TCD_O separately. As a result, it is possible to improve the process efficiency and reduce the process cost.

Hereinafter, the stack structure of the display panel 10 will be described.

Figure 13:
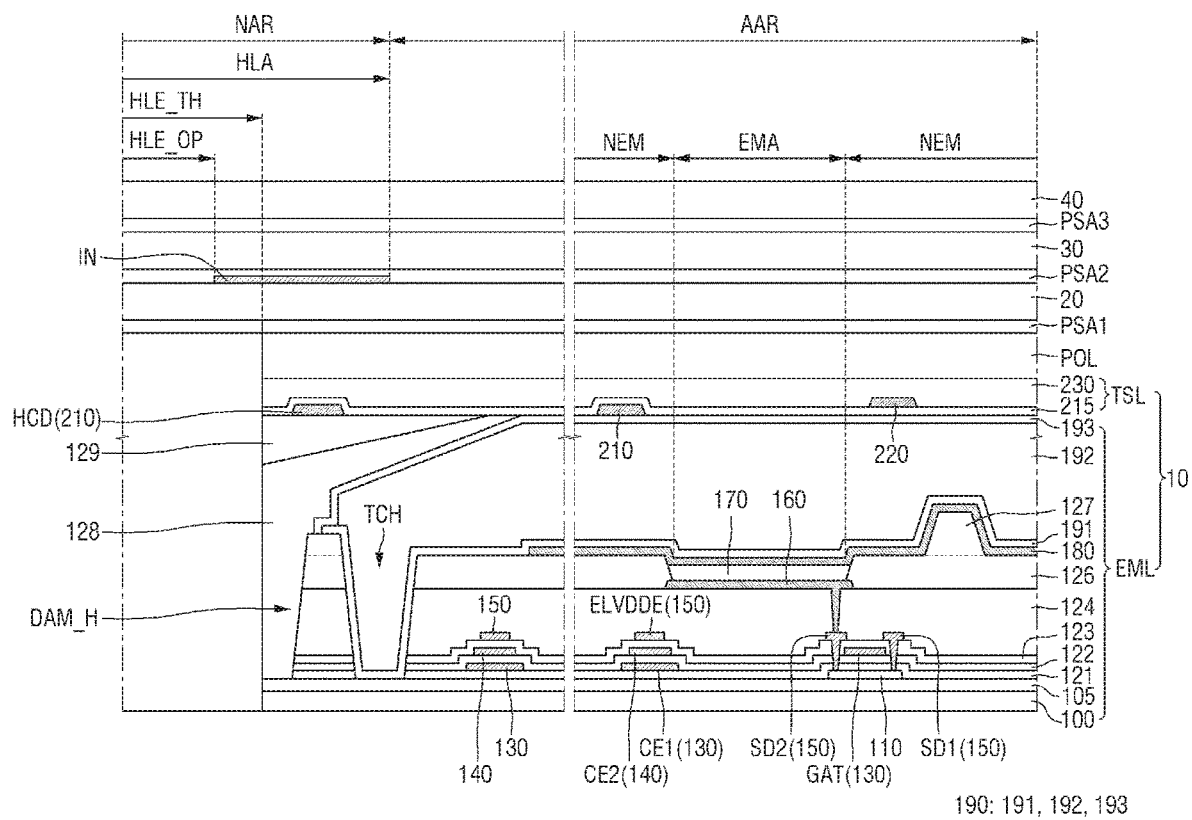
FIG. 13 is a cross-sectional view showing the vicinity of one pixel and a hole area of a display device according to an embodiment of the present disclosure.

FIG. 13 is a cross-sectional view showing the vicinity of one pixel and a hole area of a display device according to an embodiment of the present disclosure.

Referring to FIG. 13, the display panel 10 of the display device 1 may include an emissive layer EML (or a light-emitting member) that emits light and a touch layer TSL sensing a touch input. The emissive layer EML and the touch layer TSL may be formed integrally.

The emissive layer EML may include a substrate 100, a buffer layer 105, a semiconductor layer 110, a first insulating layer 121, a first gate conductive layer 130, a second insulating layer 122, a second gate conductive layer 140, a third insulating layer 123, a data conductive layer 150, a fourth insulating layer 124, an anode electrode 160, a bank layer 126 including an opening exposing the anode electrode 160, a light-emitting layer 170 disposed in the opening of the bank layer 126, a cathode electrode 180 disposed on the light-emitting layer 170 and the bank layer 126, and a thin encapsulation layer 190 (i.e., an encapsulation layer) disposed on the cathode electrode 180. Each of the layers described above may be made up of a single film, or a stack of multiple films. Other layers may be further disposed between the layers.

The substrate 100 may support layers disposed thereon. The substrate 100 may be made of an insulating material such as a polymer resin, or an inorganic material such as glass and quartz. It is, however, to be understood that the present disclosure is not limited thereto. The substrate 100 may be a flexible substrate that may be bent, rolled or folded.

The buffer layer 105 is disposed on the substrate 100. The buffer layer 105 may include or may be formed of silicon nitride, silicon oxide, silicon oxynitride, or the like.

The semiconductor layer 110 is disposed on the buffer layer 105. The semiconductor layer 110 forms a channel of a thin-film transistor of the pixel PX.

The first insulating layer 121 is disposed on the semiconductor layer 110. The first insulating layer 121 may be a first gate insulating film having gate insulating features.

The first gate conductive layer 130 is disposed on the first insulating layer 121. The first gate conductive layer 130 may include a gate electrode GAT of the thin-film transistor of the pixel PX and a scan line connected thereto, a first electrode CE1 of a storage capacitor.

A second insulating layer 122 may be disposed on the first gate conductive layer 130. The second insulating layer 122 may be an interlayer dielectric layer or a second gate insulating layer.

The second gate conductive layer 140 is disposed on the second insulating layer 122. The second gate conductive layer 140 may include a second electrode CE2 of the storage capacitor.

The third insulating layer 123 is disposed on the second gate conductive layer 140. The third insulating layer 123 may be an interlayer dielectric layer.

The data conductive layer 150 is disposed on the third insulating layer 123. The data conductive layer 150 may include a first electrode SD1 and a second electrode SD2 of the thin-film transistor of the pixel. The first electrode SD1 and the second electrode SD2 of the thin-film transistor may be electrically connected to the source region and the drain region of the semiconductor layer 110, respectively, through contact holes passing through the third insulating layer 123, the second insulating layer 122 and the first insulating layer 121.

The fourth insulating layer 124 is disposed on the data conductive layer 150. The fourth insulating layer 124 covers the data conductive layer 150. The fourth insulation layer 124 may be a via layer.

The anode electrode 160 is disposed on the fourth insulating layer 124. The anode electrode 160 may be a pixel electrode disposed in each of the pixels. The anode electrode 160 may be electrically connected to the second electrode SD2 of the thin-film transistor through a contact hole penetrating through the fourth insulating layer 124. The anode electrode 160 may at least partially overlap the emission area EMA.

The anode electrode 160 may have, but is not limited to, a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof. A layer having a higher work function may be disposed on a reflective material layer so that it is disposed closer to the light-emitting layer 170. The anode electrode 160 may have, but is not limited to, a multilayer structure of ITO/Mg, ITO/MgF, ITO/Ag, and ITO/Ag/ITO.

A bank layer 126 may be disposed on the anode electrode 160. The bank layer 126 is disposed over the anode electrode 160 and may include or may be provided with an opening exposing the anode electrode 160. The emission area EMA and the non-emission area NEM may be separated by the bank layer 126 and the openings thereof.

The spacer 127 may be disposed on the bank layer 126. The spacer 127 may serve to maintain a gap with elements disposed thereabove.

The light-emitting layer 170 is disposed on the anode electrode 160 exposed via the bank layer 126. The light-emitting layer 170 may include or may be formed of an organic material layer. The organic material layer of the emission layer may include an organic emission layer and may further include a hole injecting/transporting layer and/or an electron injecting/transporting layer.

The cathode electrode 180 may be disposed on the light-emitting layer 170. The cathode electrode 180 may be a common electrode disposed across the pixels. The anode electrode 160, the light-emitting layer 170 and the cathode electrode 180 may form an organic light-emitting element.

The cathode electrode 180 may include or may be formed of a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode 180 may further include a transparent metal oxide layer disposed on the material layer having a small work function.

The thin encapsulation layer 190 including a first inorganic encapsulation film 191, an organic encapsulation film 192 and a second inorganic encapsulation film 193 is disposed on the cathode electrode 180. The first inorganic encapsulation film 191 and the second inorganic encapsulation film 193 may be in contact with each other at the end of the thin encapsulation layer 190. The organic encapsulation film 192 may be encapsulated by the first inorganic encapsulation film 191 and the second inorganic encapsulation film 193. For example, the first inorganic encapsulation film 191 and the second inorganic encapsulation film 193 may meet each other at an uppermost surface of the edge dam structure DAM_T, and may be spaced apart from each other within an inner region defined by the edge dam structure DAM_T. At the inner region defined by the edge dam structure DAM_T, the organic encapsulation film 192 may be disposed between the first inorganic encapsulation film 191 and the second inorganic encapsulation film 193 (see, FIGS. 14 and 15).

Each of the first inorganic encapsulation film 191 and the second inorganic encapsulation film 193 may include or may be formed of silicon nitride, silicon oxide, or silicon oxynitride. The organic encapsulation film 192 may include or may be formed of an organic insulating material.

The touch layer TSL may be disposed on the thin encapsulation layer 190. When the base layer 205 of the touch layer TSL is eliminated, the first touch conductive layer 210 may be disposed on the thin encapsulation layer 190. The hole crack detection line HCD may be disposed on a second subsidiary organic film 129. The touch layer TSL has already been described above; and, therefore, the redundant descriptions will be omitted.

An anti-reflection member POL may be disposed on the touch layer TSL. A shock-absorbing layer 20 may be disposed on the anti-reflection member POL, and the cover window 30 and the cover window protection layer 40 may be disposed on the shock-absorbing layer 20. The anti-reflection member POL, the cover window 30 and the cover window protection layer 40 have already been described above; and, therefore, the redundant descriptions will be omitted.

The display panel 10 may further include a hole dam structure DAM_H (i.e., a second dam structure). The hole dam structure DAM_H may be disposed around a through hole HLE_TH. The hole dam structure DAM_H may surround the through hole HLE_TH when viewed from the top.

The hole dam structure DAM_H may include a stack of insulating layers 121, 122, 123, 124, 126 and 127. A groove TCH may be formed between the hole dam structure DAM_H and the pixel PX, where the insulating layers 121, 122, 123, 124 and 126 and the metal layers 130, 140, 150, 160 and 180 are removed, leaving the substrate 100. At least a part of the thin encapsulation layer 190 may be disposed in the groove TCH. For example, the organic encapsulation film 192 of the thin encapsulation layer 190 may be disposed only up to the hole dam structure DAM_H, but not in the hole area HLA beyond the hole dam structure DAM_H. It is possible to prevent the organic encapsulation film 192 from overflowing into the hole area HLA by virtue of the hole dam structure DAM_H. The first inorganic encapsulation film 191 or the second inorganic encapsulation film 193 of the thin encapsulation film 190 may be further disposed beyond the hole dam structure DAM_H. Although the first inorganic encapsulation film 191 and the second inorganic encapsulation film 193 are not open through the through hole HLE_TH but are terminated on the hole dam structure DAM_H before the through hole HLE_TH in the drawings, the present disclosure is not limited thereto.

The hole area HLA may overlap the hole dam structure DAM_H in the thickness direction (the third direction DR3) of the display device 1, but not with the pixel PX. Accordingly, no image or video may be displayed on the hole area HLA. It is, however, to be understood that the present disclosure is not limited thereto. Even if the hole area HLA partially overlaps with the pixel PX, the light exiting from the pixel PX may be blocked by the print layer IN, and thus no image or video may be displayed to the outside, i.e., it may be the non-active area NAR.

Around the through hole HLE_TH, the thin encapsulation layer 190 may be inclined downward toward the through hole HLE_TH. In order to provide a flat surface over the inclined surface around the through hole HLE_TH, one or more organic films 128 and 129 may be further disposed on the thin encapsulation layer 190 For example, a first subsidiary organic film 128 may be disposed on the organic encapsulation film 192, and a second subsidiary organic film 129 may be disposed on the first subsidiary organic film 128. The level difference created by the inclined surface around the through hole HLE_TH may be filled with the first subsidiary organic film 128 and the second subsidiary organic film 129 to form a flat surface.

Figure 14:
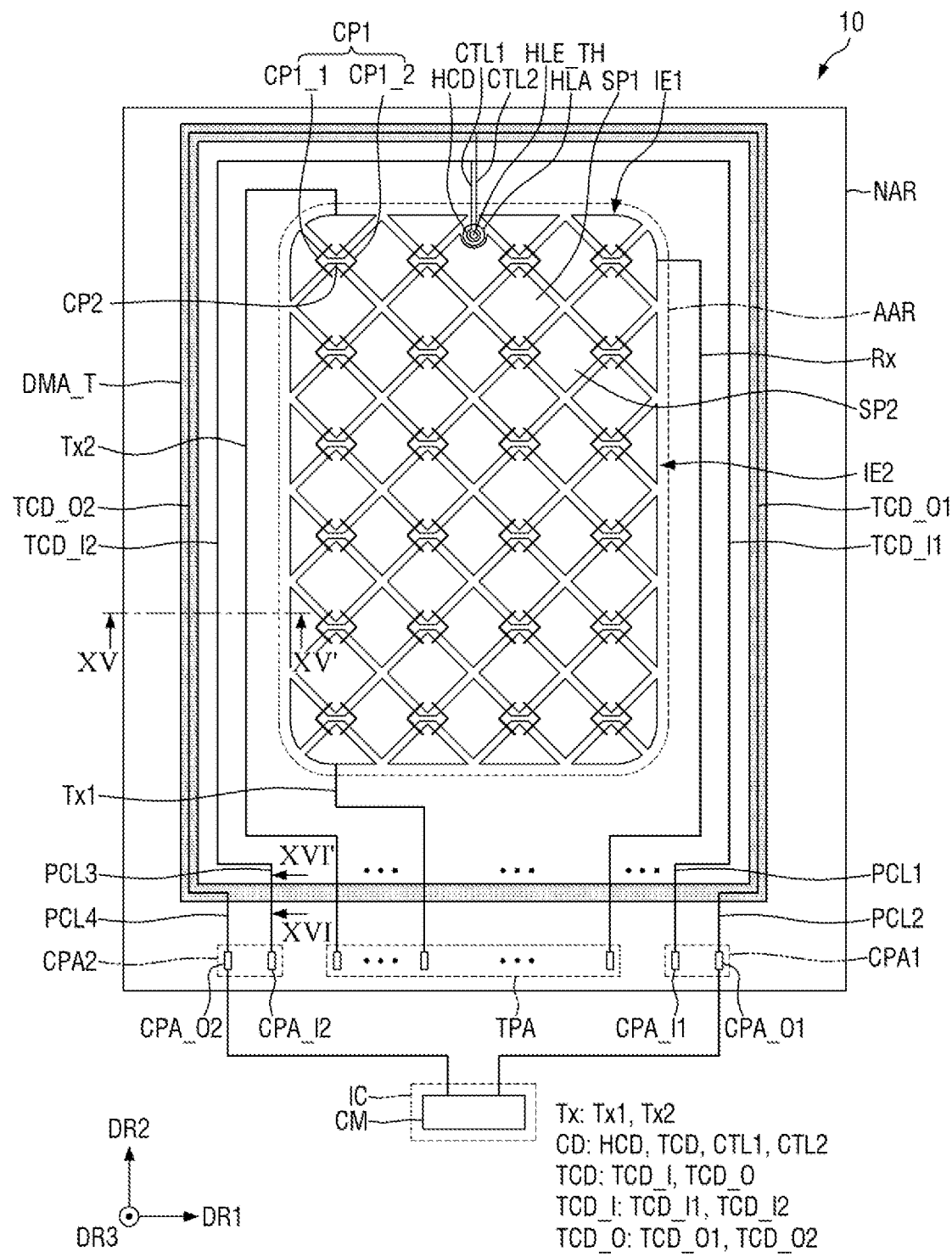
FIG. 14 is a schematic plan view showing a layout of a display panel including an edge dam structure according to an embodiment of the present disclosure.

When the display panel 10 includes the flexible substrate 100, the display panel 10 may further include the edge dam structure DAM_T (see FIG. 14). The edge dam structure DAM_T (see FIG. 14) may overlap the edge crack detection lines TCD (see FIG. 14). More detailed description thereon will be given with reference to FIGS. 14 and 15.

Figure 15:
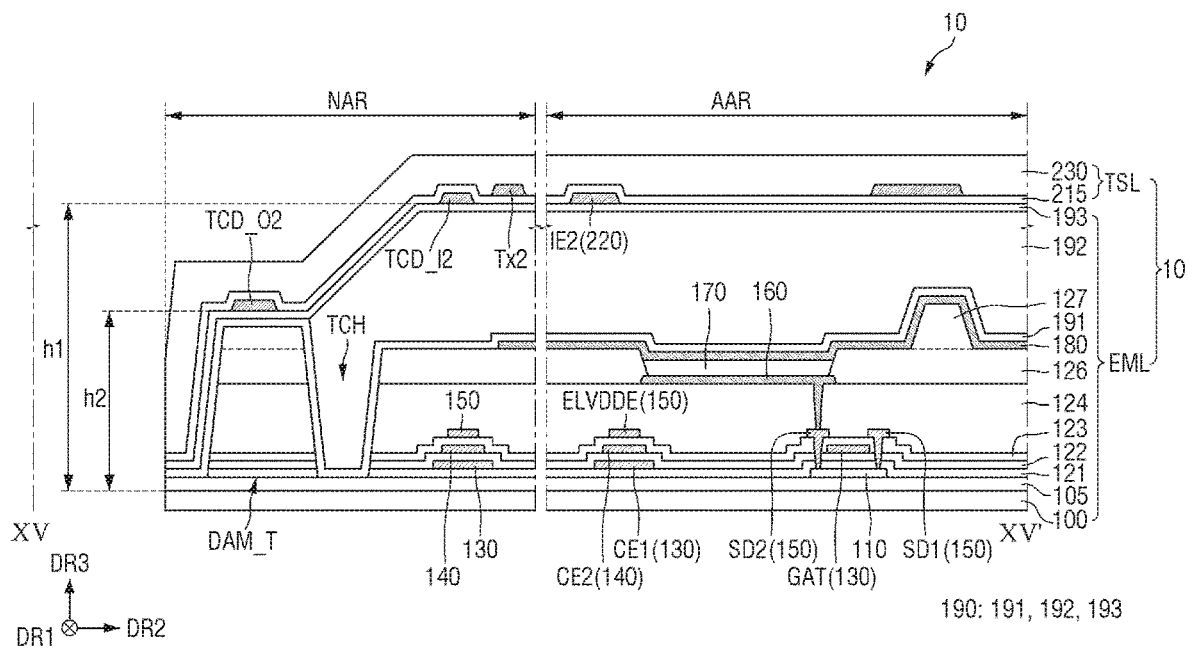
FIG. 15 is a cross-sectional view taken along line XV-XV' of FIG. 14 according to an embodiment of the present disclosure.

FIG. 14 is a schematic plan view showing a layout of a display panel including an edge dam structure according to an embodiment. FIG. 15 is a cross-sectional view taken along line XV-XV' of FIG. 14. FIGS. 14 and 15 show the display panel 10 when it is expanded.

Referring to FIGS. 14 and 15, the display panel 10 may further include the edge dam structure DAM_T. The configuration of the edge dam structure DAM_T may be substantially identical to the configuration of the hole dam structure DAM_H. The detailed description thereon will be omitted. A groove TCH may be formed between the edge dam structure DAM_T and the pixel PX, where the insulating layers 121, 122, 123, 124 and 126 and the metal layers 130, 140, 150, 160 and 180 are removed, leaving the substrate 100.

The edge dam structure DAM_T may be disposed along the edges of the display panel 10. The edge dam structure DAM_T may be disposed in the non-active area NAR and may surround the active area AAR when viewed from the top. The edge dam structure DAM_T may be disposed on one side and the opposite side of the active area AAR in the first direction DR1, and may be disposed on one side and the opposite side of the active area AAR in the second direction DR2. The direction in which the edge dam structure DAM_T is extended may be substantially identical to the direction in which the adjacent edge crack detection lines TCD are extended when viewed from the top. For example, the dam structure DAM_T disposed on one side and the opposite side of the active area AAR in the first direction DR1 may be extended in the second direction DR2, and the dam structure DAM_T disposed on one side and the opposite side of the active area AAR in the second direction DR2 may be extended in the first direction DR1.

The edge dam structure DAM_T may at least partially overlap the output line TCD_O. The edge dam structure DAM_T may be extended in the direction substantially identical to the output line TCD_O when viewed from the top where the edge dam structure DAM_T overlaps with the output line TCD_O.

The output line TCD_O may be disposed on the edge dam structure DAM_T. The output line TCD_O may be disposed on the first inorganic encapsulation film 191 of the thin encapsulation layer 190 covering the edge dam structure DAM_T. The first inorganic encapsulation film 191 of the thin encapsulation layer 190 may cover the edge dam structure DAM_T in the edge area of the display panel 10 and may be extended from the inner side to the outer side of the edge dam structure DAM_T.

The output line TCD_O may be disposed on the outer side of the organic encapsulation film 192 of the thin encapsulation layer 190. For example, the organic encapsulation film 192 of the thin encapsulation layer 190 may not be disposed between the output line TCD_O and the edge dam structure DAM_T where the output line TCD_O and the edge dam structure DAM_T overlap each other. For example, the output line TCD_O may overlap the edge dam structure DAM_T but, does not overlap the organic encapsulation film 192 of the thin encapsulation layer 190. The output line TCD_O may overlap at least one of the first inorganic encapsulation film 191 and the second inorganic encapsulation film 193 of the thin encapsulation layer 190 where the output line TCD_O overlaps the edge dam structure DAM_T. For the simplicity of drawings, FIG. 15 shows the output line TCD_O2 which overlaps the edge dam structure DAM_T (e.g., the left portion of the edge dam structure DAM_T in FIG. 14) and first portions of the first and second inorganic encapsulation films 191 and 193. The output line TCD_O2 may be disposed on an uppermost surface of the edge dam structure DAM_T with the first portions of the first and second inorganic encapsulation films 191 and 193 between the output line TCD_O2 and the uppermost surface of the edge dam structure DAM_T. The description of FIG. 5 may be also applied to the output line TCD_O1. For example, the output line TCD_O2 may overlap the edge dam structure DAM_T (e.g., the right portion of the edge dam structure DAM_T in FIG. 14) and second portions of the first and second inorganic encapsulation films 191 and 193. The output line TCD_O2 may be disposed on an uppermost surface of the edge dam structure DAM_T with the second portions of the first and second inorganic encapsulation films 191 and 193 between the output line TCD_O2 and the uppermost surface of the edge dam structure DAM_T.

The input line TCD_I may be disposed more to the inside of the display panel 10 than the edge dam structure DAM_T. The input line TCD_I may be disposed on the organic encapsulation film 192 of the thin encapsulation layer 190 and may overlap the organic encapsulation film 192 of the thin encapsulation layer 190.

The input line TCD_I may be positioned higher than the output line TCD_O from one surface or the opposite surface of the substrate 100. For example, the input line TCD_I may be positioned at a first height h1 with respect to one surface of the substrate 100, and the output line TCD_O may be positioned at a second height h2 with respect to the surface of the substrate 100. In such case, the input line TCD_I may be positioned at the first height h1 with respect to one surface of the substrate 100 which is higher than the second height h2.

As the output line TCD_O is disposed on the outer side of the input line TCD_I and disposed on the outer side of the organic encapsulation film 192 of the thin encapsulation layer 190, it is possible to more efficiently detect if there is a crack around the edge of the display panel 10. For example, if a crack occurs in the first inorganic encapsulation film 191 of the thin encapsulation layer 190, the crack may propagate from the outer side to the inner side of the display panel 10. Therefore, as the output line TCD_O is disposed on the outer side of the input line TCD_I and disposed on the outer side of the organic encapsulation film 192 of the thin encapsulation layer 190, it is possible to detect a crack before the crack reaches the organic encapsulation film 192 of the thin encapsulation layer 190. As a result, the reliability of the display panel 10 may improve.

In addition, as the output line TCD_O does not overlap the organic encapsulation film 192 of the thin encapsulation layer 190, if a crack occurs, it is possible to suppress or avoid the organic encapsulation film 192 of the thin encapsulation layer 190 from disturbing the detection of the crack. Accordingly, it is possible to detect a crack more reliably. At the same time, as the input line TCD_I is disposed on the organic encapsulation film 192 of the thin encapsulation layer 190, it is possible to reduce the influence on the input line TCD_I by cracks so that the process of detecting cracks may be carried out more stably.

Figure 16:
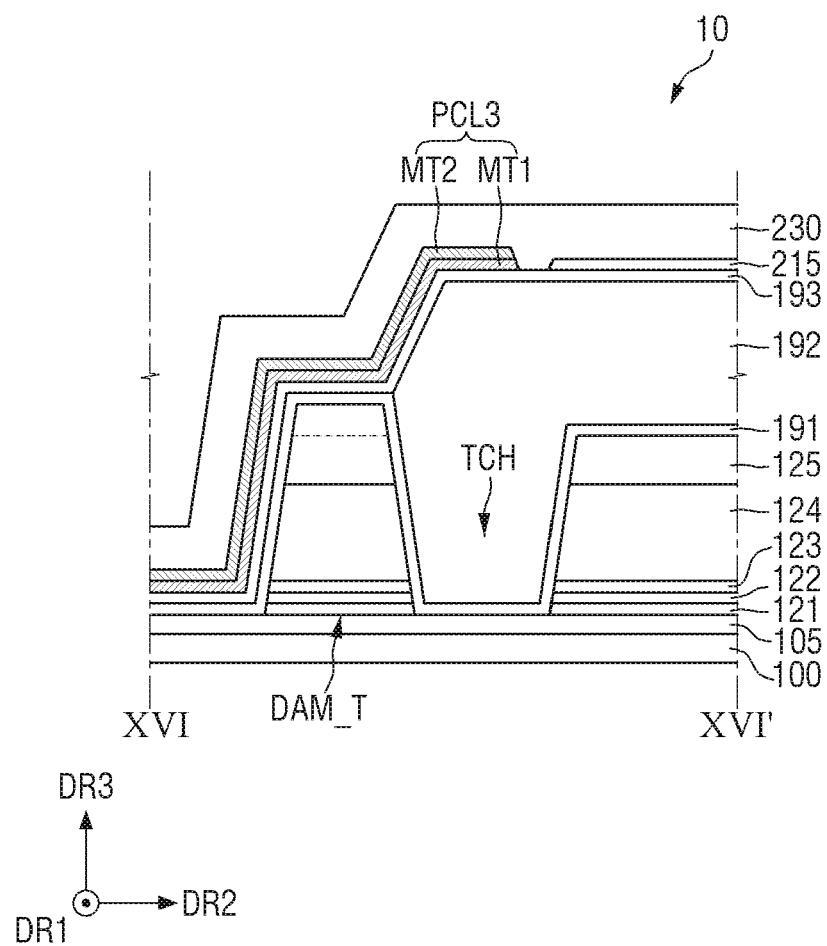
FIG. 16 is a cross-sectional view taken along line XVI-XVI' shown in FIG. 14 according to an embodiment of the present disclosure.

FIG. 16 is a cross-sectional view taken along line XVI-XVI' shown in FIG. 14. FIG. 16 shows only a third pad connection line PCL3. It is to be understood that the following description may be equally applied to the first, second and fourth pad connection lines PCL1, PCL2 and PCL4 as well.

Referring to FIG. 16, the third pad connection line PCL may include a stack of layers. The third pad connection line PCL may include a first conductive pattern MT1 and a second conductive pattern MT2 sequentially stacked. The first conductive pattern MT1 may be formed as the first touch conductive layer 210 (see FIG. 9), and the second conductive pattern MT2 may be formed as the second touch conductive layer 220 (see FIG. 9). The entire first conductive pattern MT1 and the entire second conductive pattern MT2 may be in contact with each other. The first touch insulating layer 215 may be removed from where the first conductive pattern MT1 is disposed.

Accordingly, the third pad connection line PCL is extended in the second direction DR2, and the edge dam structure DAM_T adjacent to the third pad connection line PCL is extended in the first direction DR1, so that it is possible to suppress or prevent defects such as disconnection of the third pad connection line PCL even though the third pad connection line PCT and the edge dam structure DAM_T cross each other. For example, the third pad connection line PCL crossing the edge dam structure DAM_T may have a level difference due to the edge dam structure DAM_T. Since the third pad connection line PCL includes the stack of multiple layers, it is possible to suppress or prevent defects such as disconnection of the third pad connection line PCL3 despite the level difference due to the edge dam structure DAM_T.

Hereinafter, other embodiments of the present disclosure will be described. In the following description, the same or similar elements will be denoted by the same or similar reference numerals, and redundant descriptions will be omitted or briefly described. Descriptions will be made focusing on differences from the above embodiments.

Figure 17:
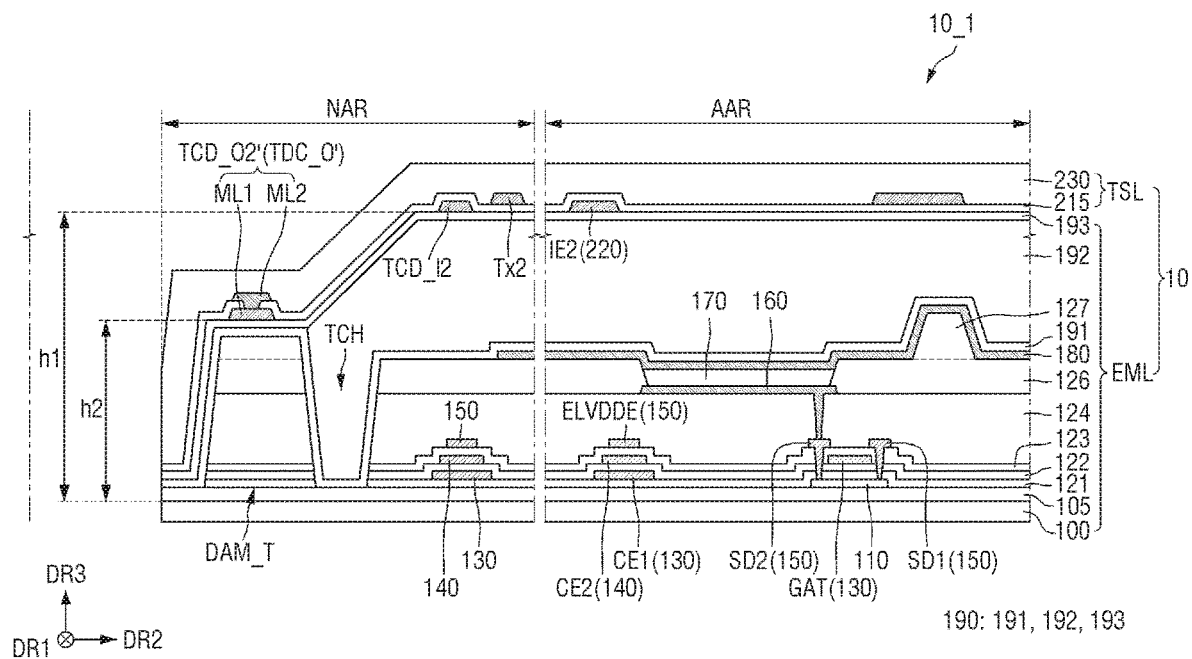
FIG. 17 is a cross-sectional view of a display device according to an embodiment of the present disclosure.

FIG. 17 is a cross-sectional view of a display device according to an embodiment of the present disclosure.

The embodiment of FIG. 17 is different from the embodiment of FIG. 15 in that an output line TDC_O' of a display panel 10_1 includes a stack of layers. Although FIG. 17 shows only a second output line TDC_O2', the present disclosure is not limited thereto. It is to be understood that the following description may be equally applied to the entire output line TDC_O'.

For example, the second output line TDC_O2' may include a first conductive line ML1 and a second conductive line ML2 sequentially stacked. The first conductive line MT1 may be formed as the first touch conductive layer 210 (see FIG. 9), and the second conductive line MT2 may be formed as the second touch conductive layer 220 (see FIG. 9). The first conductive line ML1 and the second conductive line ML2 may be in contact with each other through a contact hole CNT_M penetrating the first touch insulating layer 215 to be electrically connected with each other. It is, however, to be understood that the present disclosure is not limited thereto. For example, the first touch insulating layer 215 may be removed from where the first conductive line ML1 is disposed, so that the entire first conductive line ML1 and the entire second conductive line ML2 may be in direct contact with each other.

As the output line TCD_O does not overlap the organic encapsulation film 192 of the thin encapsulation layer 190, it is possible to detect cracks more effectively, so that the reliability of the display panel 10_1 may improve. In addition, as the output line TDC_O' includes a stack of multiple layers, the reliability of the output line TDC_O' may improve, and the reliability of the process of detecting cracks may improve.

Figure 18:
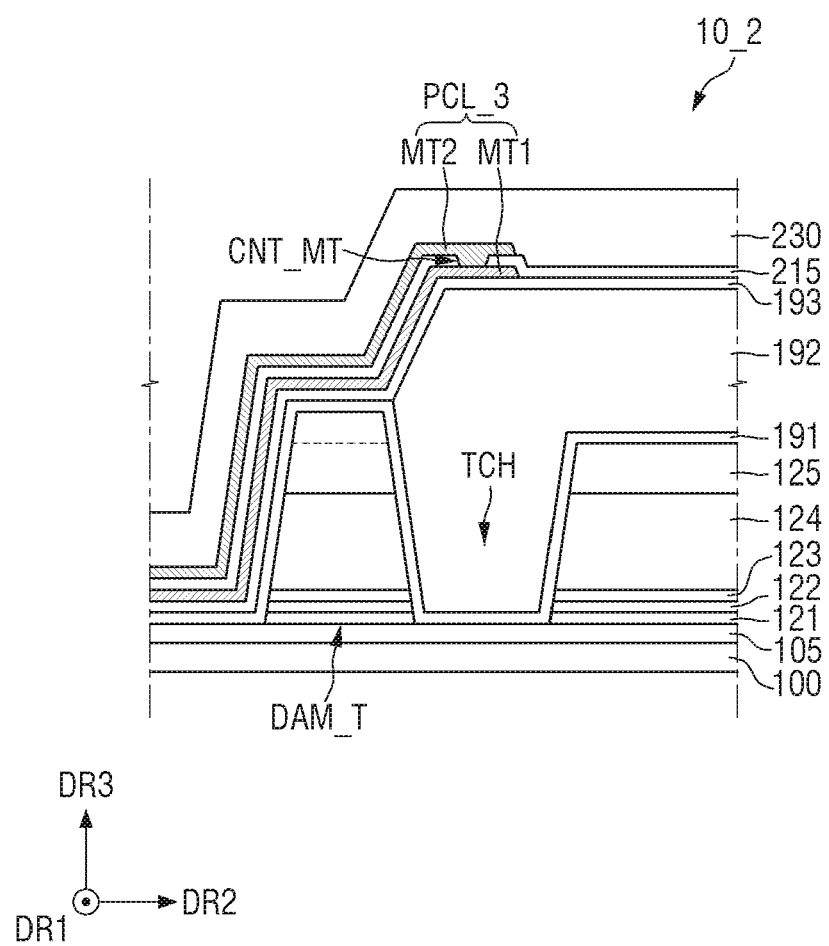
FIG. 18 is a cross-sectional view of a display device according to an embodiment of the present disclosure.

FIG. 18 is a cross-sectional view of a display device according to an embodiment of the present disclosure.

The embodiment of FIG. 18 is different from the embodiment of FIG. 16 in that a third pad connection line PCL_3 of a display panel 10_2 includes a stack of layers, and the layers are in contact with each other through a contact hole CNT_MT. For example, a first conductive pattern MT1 and a second conductive pattern MT2 of the third pad connection line PCL_3 may be in contact with each other through the contact hole CNT_MT penetrating through the first touch insulating layer 215 and thus may be electrically connected with each other.

Since the third pad connection line PCL_3 includes the stack of multiple layers, it is possible to suppress or prevent defects such as disconnection of the third pad connection line PCL_3 despite the level difference due to the edge dam structure DAM_T. In addition, as the first touch insulating layer 215 is disposed between the first conductive pattern MT1 and the second conductive pattern MT2, it is possible to more effectively suppress or prevent defects such as disconnection.

In concluding the detailed description, those skilled in the art will appreciate that many variations and modifications can be made to the embodiments without substantially departing from the principles of the present disclosure. Therefore, the disclosed preferred embodiments of the invention are used in a generic and descriptive sense only and not for purposes of limitation.

What is claimed is:

1. A display device comprising:
   a substrate;
   a plurality of pixels disposed on a first surface of the substrate;
   an encapsulation layer disposed above the plurality of pixels and comprising an organic encapsulation film;
   a first dam structure disposed on the substrate and surrounding an outer boundary of the plurality of pixels;
   a plurality of crack detection lines comprising an output line disposed on the first dam structure without overlapping the organic encapsulation film, and an input line electrically connected to the output line and disposed on the organic encapsulation film; and
   a through hole penetrating the first surface of the substrate and a second surface of the substrate opposite to the first surface of the substrate in a thickness direction,
   wherein the plurality of crack detection lines further comprises a hole crack detection line disposed around the through hole and having an open-curved shape, and
   wherein one end of the hole crack detection line is electrically connected to the input line, and another end of the hole crack detection line is electrically connected to the output line.

2. The display device of claim 1,
   wherein the output line and the input line at least partially surround the outer boundary of the plurality of pixels, and
   wherein the output line is adjacent to an outer side of the input line.

3. The display device of claim 1, further comprising:
   a second dam structure disposed on the substrate and surrounding the through hole.

4. The display device of claim 1,
   wherein the output line is adjacent to an outer side of the organic encapsulation film.

5. The display device of claim 4,
   wherein the encapsulation layer further comprises a first inorganic encapsulation film and a second inorganic encapsulation film disposed with the organic encapsulation film therebetween, and
   wherein the output line overlaps at least one of the first inorganic encapsulation film and the second inorganic encapsulation film in the thickness direction where the output line overlaps the first dam structure.

6. The display device of claim 5,
   wherein the first inorganic encapsulation film and the second inorganic encapsulation film are disposed between the output line and the first dam structure where the output line overlaps the first dam structure.

7. The display device of claim 4,
   wherein the outer side of the organic encapsulation film includes a first outer side extending along a side surface of the first dam structure and a second outer side extending from the first outer side to an upper surface of the organic encapsulation film,
   wherein the output line is adjacent to where the first outer side and the second outer side meet each other, and
   wherein the first outer side and the second outer side have different slopes with each other.

8. The display device of claim 7,
   wherein the input line is disposed on the upper surface of the organic encapsulation film,
   wherein the output line is disposed on an uppermost surface of the first dam structure, and
   wherein the input line is positioned higher than the output line with respect to the substrate.

9. The display device of claim 1,
   wherein the input line is positioned higher than the output line with respect to an upper surface of the substrate.

10. The display device of claim 1, further comprising:
    a touch layer disposed on the encapsulation layer and comprising a first touch conductive layer disposed on the encapsulation layer, a first touch insulating layer disposed on the first touch conductive layer and a second touch conductive layer disposed on the first touch insulating layer,
    wherein the output line and the input line are formed as the first touch conductive layer.

11. The display device of claim 10,
    wherein the touch layer further comprises a first sensing electrode extended in a first direction and a second sensing electrode extended in a second direction crossing the first direction, and
    wherein the first sensing electrode and the second sensing electrode are formed as the second touch conductive layer.

12. The display device of claim 11,
    wherein one of the first sensing electrode and the second sensing electrode is connected to a touch driving line, and the other one is connected a touch sensing line.

13. The display device of claim 1, further comprising:
    a crack detection member electrically connected to the output line.

14. The display device of claim 13, further comprising:
    a driving chip,
    wherein the crack detection member is implemented as a part of the driving chip.

15. A display device comprising:
a display panel comprising first and second side surfaces, and a front surface disposed therebetween in a first direction, wherein the first and second side surfaces are disposed on opposite sides of the front surface in the first direction, respectively, and are curved,
wherein the display panel comprises:
   a plurality of pixels;
   a plurality of crack detection lines comprising an output line and an input line, wherein the output line and the input line are adjacent to an outer boundary of the plurality of pixels and extend along an edge of the display panel; and
   a crack detection member electrically connected to the output line,
wherein the output line and the input line extend across the front surface, the first side surface and the second side surface, and
wherein the output line is adjacent to an outer side of the input line and is electrically connected to the input line.

16. The display device of claim 15,
wherein the display panel further comprises:
a substrate which is provided with the plurality of pixels;
a dam structure disposed on the substrate and surrounding the outer boundary of the plurality of pixels; and
an organic encapsulation film disposed at a region surrounded by the dam structure,
wherein the output line does not overlap the organic encapsulation film, and
wherein the input line overlaps the organic encapsulation film.

17. The display device of claim 16, further comprising:
a first inorganic encapsulation film and a second inorganic encapsulation film disposed with the organic encapsulation film therebetween,
wherein the output line overlaps at least one of the first inorganic encapsulation film and the second inorganic encapsulation film in a thickness direction where the output line overlaps the dam structure.

18. The display device of claim 17,
wherein the organic encapsulation film is disposed between the first inorganic encapsulation film and the second inorganic encapsulation film at the region surrounded by the dam structure.

19. The display device of claim 17,
wherein the first inorganic encapsulation film and the second inorganic encapsulation film are disposed between the output line and the dam structure where the output line overlaps the dam structure.

20. The display device of claim 16,
wherein the output line is adjacent to an outer side of the organic encapsulation film.

21. The display device of claim 15,
wherein the display panel further comprises a substrate on which the plurality of pixels and the plurality of crack detection lines are disposed, and
wherein the input line is positioned higher than the output line with respect to an upper surface of the substrate.

22. The display device of claim 15, further comprising:
a driving chip,
wherein the crack detection member is implemented as a part of the driving chip.

23. The display device of claim 15, further comprising:
a first pad, a second pad, a third pad and a fourth pad;
a first pad connection line connected to the first pad and a first end of the input line;
a second pad connection line connected to the second pad and a second end of the input line;
a third pad connection line connected to the third pad and a first end of the output line; and
a fourth pad connection line connected to the fourth pad and a second end of the output line,
wherein the first pad, the second pad, the third pad and the fourth pad are spaced apart from each other, and
wherein the first pad connection line, the second pad connection line, the third pad connection line and the fourth pad connection line are spaced apart from each other.

* * * * *